United States Patent
Ye et al.

(10) Patent No.: US 10,812,030 B2
(45) Date of Patent: Oct. 20, 2020

(54) HIGH-LINEARITY VARIABLE GAIN AMPLIFIER WITH BYPASS PATH

(71) Applicant: SKYWORKS SOLUTIONS, INC., Woburn, MA (US)

(72) Inventors: Peihua Ye, Irvine, CA (US); Patrick Marcus Naraine, Irvine, CA (US); Adrian John Bergsma, Kanata (CA); Peter Harris Robert Popplewell, Ottawa (CA); Thomas Obkircher, Santa Ana, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/551,955

(22) Filed: Aug. 27, 2019

(65) Prior Publication Data
US 2019/0386624 A1 Dec. 19, 2019

Related U.S. Application Data

(63) Continuation of application No. 15/808,486, filed on Nov. 9, 2017, now Pat. No. 10,439,576.
(Continued)

(51) Int. Cl.
*H03F 3/45* (2006.01)
*H03G 1/00* (2006.01)
(Continued)

(52) U.S. Cl.
CPC ......... *H03G 1/0088* (2013.01); *H03F 1/3211* (2013.01); *H03F 3/195* (2013.01);
(Continued)

(58) Field of Classification Search
CPC ............ H03G 1/0088; H03G 2201/106; H03F 3/195; H03F 3/45179; H03F 2200/451; H03F 2200/294
(Continued)

(56) References Cited

U.S. PATENT DOCUMENTS 6,144,535 A   11/2000   Ishii
6,201,441 B1   3/2001   Suematsu et al.
(Continued)

OTHER PUBLICATIONS 3.3 V, Upstream Cable Line Driver, AD8324, Analog Devices, Inc., 2016, <http://www.analog.com/media/en/technical-documentation/data-sheets/AD8324.pdf> [retrieved from the Internet on Dec. 15, 2017].
(Continued)

*Primary Examiner* — Khanh V Nguyen
*Assistant Examiner* — Khiem D Nguyen
(74) *Attorney, Agent, or Firm* — Lando & Anastasi, LLP

(57) ABSTRACT

Aspects and examples described herein provide a variable gain amplifier circuit and assembly. In one example, a variable gain amplifier circuit includes a signal input, a signal output, and a variable gain amplifier including a plurality of unit cell groups coupled between the signal input and the signal output, the variable gain amplifier configured to provide an adjustable gain to a signal received at the signal input during each of a plurality of amplify modes of the variable gain amplifier, each of the plurality of amplify modes corresponding to at least one unit cell group of the plurality of unit cell groups. A bypass path including a fixed attenuator is coupled in parallel with the variable gain amplifier between the signal input and the signal output to selectively couple the signal input to the signal output through the fixed attenuator during a bypass mode.

20 Claims, 17 Drawing Sheets

Related U.S. Application Data

(60) Provisional application No. 62/420,326, filed on Nov. 10, 2016.

(51) Int. Cl.
*H03F 3/195* (2006.01)
*H03F 1/32* (2006.01)
*H03F 3/72* (2006.01)

(52) U.S. Cl.
CPC ..... *H03F 3/45179* (2013.01); *H03F 3/45188* (2013.01); *H03F 3/72* (2013.01); *H03F 2200/294* (2013.01); *H03F 2200/451* (2013.01); *H03F 2203/45338* (2013.01); *H03F 2203/45731* (2013.01); *H03F 2203/7233* (2013.01); *H03F 2203/7236* (2013.01); *H03F 2203/7239* (2013.01); *H03G 2201/103* (2013.01); *H03G 2201/106* (2013.01); *H03G 2201/504* (2013.01)

(58) Field of Classification Search
USPC .......................................... 330/252–254, 51
See application file for complete search history.

(56) References Cited

U.S. PATENT DOCUMENTS

| | | | |
|---|---|---|---|
| 6,208,203 B1 | 3/2001 | Jung et al. | |
| 6,408,069 B1 | 6/2002 | Furlong | |
| 7,342,955 B2 | 3/2008 | Forest et al. | |
| 7,649,418 B2 | 1/2010 | Matsui | |
| 7,952,433 B2 | 5/2011 | An et al. | |
| 8,446,143 B2 | 5/2013 | Whittington et al. | |
| 9,496,833 B2* | 11/2016 | Kusuda | H03F 3/387 |
| 10,439,576 B2* | 10/2019 | Ye | H03F 3/195 |
| 2003/0058041 A1 | 3/2003 | Koizumi | |
| 2006/0001489 A1* | 1/2006 | Park | H03F 3/211 |
| | | | 330/254 |
| 2011/0256857 A1 | 10/2011 | Chen et al. | |
| 2016/0248462 A1 | 8/2016 | Danilenko et al. | |
| 2018/0131339 A1 | 5/2018 | Ye et al. | |
| 2018/0138866 A1 | 5/2018 | Liang et al. | |
| 2018/0138874 A1 | 5/2018 | Bergsma | |
| 2018/0138877 A1 | 5/2018 | Bergsma et al. | |
| 2018/0138878 A1 | 5/2018 | Domino et al. | |
| 2018/0138990 A1 | 5/2018 | Bergsma et al. | |

OTHER PUBLICATIONS

"ARA05050 Reverse Amplifier with Step Attenuator Data Sheet", Skyworks Solutions, Inc., 2016, <http://www.skyworksinc.com/uploads/documents/ARA05050_204227B.pdf> [retrieved from the Internet on Dec. 15, 2017].

"ARA2000 Address-Programmable Reverse Amplifier with Step Attenuator Data Sheet", Skyworks Solutions, Inc., 2016, <http://www.skyworksinc.com/uploads/documents/ARA2000_204228B.pdf> [retrieved from the Internet on Dec. 15, 2017].

"BGA3131 DOCSIS 3.1 upstream amplifier Product data sheet", NXP Semiconductors N.V., 2016, <https://www.nxp.com/docs/en/data-sheet/BGA3131.pdf> [retrieved from the Internet on Dec. 12, 2017].

"DOCSIS 3.0 Upstream Amplifier", Maxim, 2009, <https://media.digikey.com/pdf/Data%20Sheets/Maxim%20PDFs/MAX3518.pdf> [retrieved from the Internet on Dec. 15, 2017].

* cited by examiner

HIGH-LINEARITY VARIABLE GAIN AMPLIFIER WITH BYPASS PATH

CROSS-REFERENCE TO RELATED APPLICATIONS

This application claims priority under 35 U.S.C. § 120 as a continuation of U.S. patent application Ser. No. 15/808,486 titled HIGH-LINEARITY VARIABLE GAIN AMPLIFIER WITH BYPASS PATH filed on Nov. 9, 2017, which claims the benefit under 35 U.S.C. § 119(e) of U.S. Provisional Patent Application No. 62/420,326 titled HIGH-LINEARITY VARIABLE GAIN AMPLIFIER WITH BYPASS PATH filed on Nov. 10, 2016, each of which is herein incorporated by reference in its entirety for all purposes.

This application further relates to U.S. patent application Ser. No. 15/808,341 filed on Nov. 9, 2017, and titled WIDE DYNAMIC RANGE AMPLIFIER SYSTEM, now U.S. Pat. No. 10,396,737, which claims the benefit under 35 U.S.C. § 119(e) of U.S. Provisional Patent Application No. 62/420,875 titled WIDE DYNAMIC RANGE AMPLIFIER SYSTEM filed on Nov. 11, 2016, each of which is herein incorporated by reference in its entirety for all purposes.

This application further relates to U.S. patent application Ser. No. 15/808,389 filed on Nov. 9, 2017, and titled AMPLIFIER SYSTEM WITH DIGITAL SWITCHED ATTENUATOR, now U.S. Pat. No. 10,396,735, which claims the benefit under 35 U.S.C. § 119(e) of U.S. Provisional Patent Application No. 62/420,681 titled AMPLIFIER SYSTEM WITH DIGITAL SWITCHED ATTENUATOR filed on Nov. 11, 2016, each of which is herein incorporated by reference in its entirety for all purposes.

This application further relates to U.S. patent application Ser. No. 15/808,372 filed on Nov. 9, 2017, and titled TRANSIENT OUTPUT SUPPRESSION IN AN AMPLIFIER, which claims the benefit under 35 U.S.C. § 119(e) of U.S. Provisional Patent Application No. 62/420,907 titled TRANSIENT OUTPUT SUPPRESSION IN AN AMPLIFIER filed on Nov. 11, 2016, each of which is herein incorporated by reference in its entirety for all purposes.

This application further relates to U.S. patent application Ser. No. 15/808,358 filed on Nov. 9, 2017, and titled REDUCING IMPEDANCE DISCONTINUITIES ON A SHARED MEDIUM, now U.S. Pat. No. 10,256,921, which claims the benefit under 35 U.S.C. § 119(e) of U.S. Provisional Patent Application No. 62/421,084 titled REDUCING IMPEDANCE DISCONTINUITIES ON A SHARED MEDIUM filed on Nov. 11, 2016, each of which is herein incorporated by reference in its entirety for all purposes.

This application further relates to U.S. patent application Ser. No. 15/808,458 filed on Nov. 9, 2017, and titled TEMPERATURE COMPENSATED OSCILLATOR, which claims the benefit under 35 U.S.C. § 119(e) of U.S. Provisional Patent Application No. 62/420,806 titled TEMPERATURE COMPENSATED OSCILLATOR filed on Nov. 11, 2016, each of which is herein incorporated by reference in its entirety for all purposes.

BACKGROUND

The Data Over Cable Service Interface Specifications (DOCSIS) are developed by CableLabs, a non-profit consortium of cable operators focused on technologies and specifications for delivery of data signals that carry information such as data, video, voice, or other information, and for delivery of additional next generation services. DOCSIS defines the signal parameters for communications transmissions over a cable service infrastructure.

Evolution in the cable industry, particularly in the cable television service, has resulted in the reduction or elimination of traditional analog television channels that previously utilized frequencies as low as 54 MHz in the United States. This has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range support by DOCSIS 3.0, covering more than five and a third octaves. Additionally, full compliance with DOCSIS 3.1 requires support for power output up to 65 dBmV into 75 Ohms across the entire spectrum. Conventional amplifiers for these systems have not met the demanding challenges of power output dynamic range across the wide spectrum range necessary for full compliance with DOCSIS 3.1 and anticipated future standards.

SUMMARY

Aspects and examples are directed to amplifier systems and components thereof, and to devices, modules, and systems incorporating same. Amplifier systems and methods disclosed herein are capable of a high range of dynamic power output across a broad frequency spectrum.

According to an aspect, provided is a variable gain amplifier circuit having a signal input and a signal output. In various examples, the variable gain amplifier circuit comprises a variable gain amplifier including a plurality of unit cell groups coupled between the signal input and the signal output, the variable gain amplifier configured to provide an adjustable gain to a signal received at the signal input during each of a plurality of amplify modes of the variable gain amplifier, each of the plurality of amplify modes corresponding to at least one unit cell group of the plurality of unit cell groups, and a bypass path including a fixed attenuator coupled in parallel with the variable gain amplifier between the signal input and the signal output to selectively couple the signal input to the signal output through the fixed attenuator during a bypass mode.

In various examples, each of the plurality of amplify modes provides a different amount of gain to the signal received at the signal input. In some examples, each of the plurality of unit cell groups includes at least one unit cell having a transistor configured to amplify the signal received at the signal input. According to various examples, each of the plurality of unit cell groups includes a different amount of unit cells. In some examples, the at least one unit cell is a cascode amplifier. In at least one example, the plurality of amplify modes includes a low gain amplify mode, a medium gain amplify mode, and a high gain amplify mode.

According to various examples, the variable gain amplifier circuit further comprises a feedback network coupled in parallel with the variable gain amplifier between the signal input and the signal output, the feedback network being configured to stabilize an input-referred linearity of the variable gain amplifier during at least one of the plurality of amplify modes. In further examples, the feedback network includes a feedback resistor. In some examples, the signal input is a differential signal input and the signal output is a differential signal output, the variable gain amplifier having a first pair of contacts corresponding to the differential signal input and a second pair of contacts corresponding to the differential signal output. In various examples, the variable gain amplifier circuit further comprises an input resistor selectively coupled between the first pair of contacts and an output resistor selectively coupled between the second pair of contacts.

According to another aspect, provided is a variable gain amplifier assembly having a signal input and a signal output. In one example, the variable gain amplifier assembly comprises a variable gain amplifier including a plurality of unit cell groups, each unit cell group of the plurality of unit cell groups including at least one unit cell having at least one transistor, the variable gain amplifier configured to apply a different amount of gain to the signal received at the signal input during each of a plurality of amplify modes, each of the plurality of amplify modes corresponding to at least one unit cell group of the plurality of unit cell groups, and a current control circuit configured to regulate a bias current provided to the at least one transistor of the at least one unit cell based on at least an amplitude of the signal received at the signal input.

In various examples, the current control circuit is configured to decrease the bias current responsive to a decrease in the amplitude of the signal received at the signal input. In some examples, the current control circuit is configured to increase the bias current responsive to an increase in the amplitude of the signal received at the signal input. According to some examples, the current control circuit includes a current mirror circuit configured to generate a reference current, the bias current being based on the reference current. In at least one example, the at least one unit cell is a cascode amplifier and the at least one transistor is a common-source transistor coupled to a common-gate transistor. In further examples, the current mirror circuit is coupled to a gate of the common-source transistor.

According to an aspect, provided is a variable gain amplifier circuit. In one example, the variable gain amplifier circuit comprises a differential signal input to receive an input signal, a differential signal output to provide an output signal, a variable gain amplifier configured to provide an adjustable gain to the input signal to generate an amplified signal as the output signal, the adjustable gain being based at least in part on a selected amplify mode of the variable gain amplifier, a first switching circuit positioned between the differential signal input and the variable gain amplifier, and a second switching circuit positioned between the differential signal output and the variable gain amplifier, the first switching circuit and the second switching circuit collectively configured to couple the variable gain amplifier between the differential signal input and the differential signal output during the selected amplify mode, and a bypass path positioned in parallel with the variable gain amplifier, the bypass path including a fixed attenuator, a third switching circuit, and a fourth switching circuit, the third switching circuit and the fourth switching circuit collectively configured to couple the differential signal input and the differential signal output through the fixed attenuator during a bypass mode.

According to various examples, each of the third switching circuit and the fourth switching circuit are further configured to decouple the differential signal input and the differential signal output from the fixed attenuator during the selected amplify mode. In various examples, each of the first switching circuit and the second switching circuit are further configured to decouple the variable gain amplifier from the differential signal input and the differential signal output during the bypass mode. In some examples, each of the first set of switches, the second set of switches, the third set of switches, and the fourth set of switches is coupled to a first die. In a further example, the first die is a Silicon-on-Insulator (SOI) die. In some examples, the variable gain amplifier is coupled to a second die. In at least one example, the second die is a bipolar complementary metal-oxide semiconductor/double-diffused metal-oxide semiconductor (BCD) laterally diffused metal-oxide semiconductor (LDMOS) die.

According to various examples, the variable gain amplifier circuit further comprises a fifth switching circuit and an input resistor, the fifth switching circuit positioned to selectively couple the input resistor to an input of the variable gain amplifier. In various examples, the variable gain amplifier circuit further comprises a sixth switching circuit coupled to an output resistor, the sixth switching circuit configured to selectively couple the output resistor to an output of the variable gain amplifier. In some examples, the variable gain amplifier circuit further comprises a feedback network coupled in parallel with the variable gain amplifier, the feedback network being configured to stabilize an input-referred linearity of the variable gain amplifier during at least the selected amplify mode. In at least one example, the feedback network is a resistive feedback network coupled between the differential signal input and the differential signal output.

According to an aspect, provided is a variable gain amplifier. In one example, the variable gain amplifier comprises an input, an output, and a plurality of unit cell groups coupled between the input and the output, the variable gain amplifier configured to provide an adjustable gain to a signal received at the input during each of a plurality of amplify modes, each of the plurality of amplify modes corresponding to at least one unit cell group of the plurality of unit cell groups, each of the plurality of unit cell groups including at least one unit cell having at least one transistor configured to amplify the signal received at the input to prove the adjustable gain.

According to various examples, each of the plurality of amplify modes provides a different amount of gain to the signal received at the variable gain amplifier. In various examples, each of the plurality of unit cell groups has a different amount of unit cells. In some examples, the plurality of amplify modes includes a low gain amplify mode, a medium gain amplify mode, and a high gain amplify mode. In at least one example, a first unit cell group corresponding to the low gain amplify mode includes a first plurality of unit cells and a second unit cell group corresponding to the medium gain amplify mode includes at least one unit cell of the first plurality of unit cells.

In various examples, each of the plurality of unit cell groups includes an invariable gain amplifier coupled in parallel with the other unit cell groups of the plurality of unit cell groups. In some examples, the input is a pair of differential input contacts, and the output is a pair of differential output contacts. In various examples, the variable gain amplifier further comprises an input resistor coupled between the pair of differential input contacts and an output resistor coupled between the pair of differential output contacts. In some examples, each of the plurality of unit cell groups is configured to receive a control signal from a controller in communication with each of the plurality of unit cell groups to dynamically switch between the plurality of amplify modes.

According to another aspect, provided is a variable gain amplifier circuit having a signal input and a signal output. In one example, the variable gain amplifier circuit comprises a variable gain amplifier including a plurality of unit cell groups coupled between the signal input and the signal output, the variable gain amplifier configured to provide an adjustable gain to a signal received at the signal input during each of a plurality of amplify modes of the variable gain amplifier, each of the plurality of amplify modes corresponding to at least one unit cell group of the plurality of unit cell groups, and a bypass path coupled in parallel with the variable gain amplifier between the signal input and the signal output to selectively couple the signal input to the signal output and bypass the variable gain amplifier, during a bypass mode.

According to various examples, each of the plurality of amplify modes provides a different amount of gain to the signal received at the signal input. In various examples, each of the plurality of unit cell groups includes at least one unit cell having a transistor configured to amplify the signal received at the signal input. In some examples, each of the plurality of unit cell groups includes a different amount of unit cells. In at least one example, the at least one unit cell is a cascode amplifier. In various examples, the plurality of amplify modes includes a low gain amplify mode, a medium gain amplify mode, and a high gain amplify mode.

In various examples, the variable gain amplifier circuit further comprises a feedback network coupled in parallel with the variable gain amplifier between the signal input and the signal output, the feedback network being configured to stabilize an input-referred linearity of the variable gain amplifier during at least one of the plurality of amplify modes. In some examples, the feedback network includes a feedback resistor. In various examples, the signal input is a differential signal input and the signal output is a differential signal output, the variable gain amplifier having a first pair of contacts corresponding to the differential signal input and a second pair of contacts corresponding to the differential signal output. In some examples, the variable gain amplifier circuit further comprises an input resistor selectively coupled between the first pair of contacts and an output resistor selectively coupled between the second pair of contacts.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

Furthermore, in the event of inconsistent usages of terms between this document and documents incorporated herein by reference, the term usage in the incorporated references is supplementary to that of this document; for irreconcilable inconsistencies, the term usage in this document controls.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
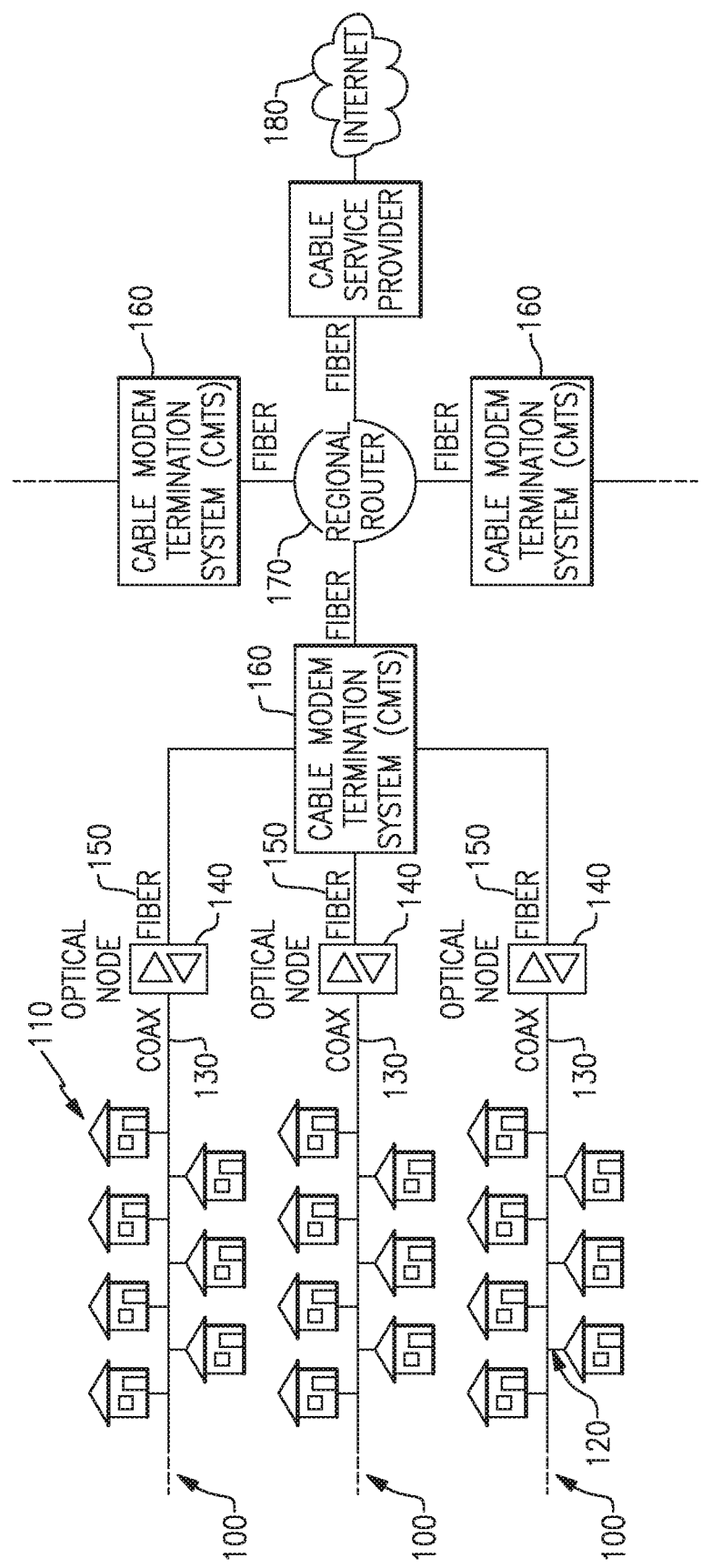
FIG. 1 is a schematic diagram of a data over cable services environment.

Aspects and examples are directed to amplifier systems and components thereof, and to devices, modules, and systems incorporating same.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Among other things, DOCSIS defines signal parameters for communications transmissions over a cable service infrastructure. The DOCSIS 3.1 specification follows upon the earlier DOCSIS 3.0 specification and includes significant changes to the interface specification for Cable Modems (CM's) and for Cable Modem Termination Systems (CMTS's). In a system for data over cable service, multiple sites, or customer premises, are typically connected to a common waveguide medium, such as a coaxial cable, that terminates at a hub operated by a cable operator. Each of the customer premises has one or more cable modems that receive data signals from the hub in a downstream direction and transmit data signals to the hub in an upstream direction. A cable modem termination system is placed at the hub and receives the individual upstream data signals from the cable modems and transmits the downstream data signals. Every data signal transmission is received by all other stations, CM's or the CMTS, coupled to the common (i.e., shared) medium. The data signals, downstream and upstream, include addressing information identifying to which cable modem they pertain, and each cable modem on the common medium generally ignores data signals not intended for it.

The cable modems on a common medium receive instructions from the CMTS directing the cable modems as to signal formatting and transmission parameters each cable modem is to use for its upstream transmissions. In particular, once associated with the network, each cable modem only transmits upstream data signals when capacity on the shared medium is assigned, or allocated, to it by the CMTS. DOCSIS 3.0 standardized upstream transmissions by the cable modems in two potential modes, TDMA mode and S-CDMA mode. Each mode includes frequency and time slot allocations to the cable modems, i.e., Frequency Division Multiple Access (FDMA) and Time Division Multiple Access (TDMA). The CMTS communicates frequency and time allocations in a particular Media Access Control (MAC) Management Message known as a bandwidth allocation map (MAP) message. Time allocations are given in mini-slots that are an integer multiple of 6.25 microseconds (µS). Modulation to be used by the cable modem is also assigned by the CMTS and is communicated in an Upstream Channel Descriptor (UCD) of a MAC Management Message. The fundamental upstream modulation scheme is quadrature amplitude modulation (QAM) with a constellation size up to 128, and the coding scheme includes Reed-Solomon (R-S) Forward Error Correction (FEC) coding, also with Trellis Coded Modulation (TCM) in North America. The S-CDMA mode further incorporates Synchronous Code Division Multiple Access (S-CDMA) as part of the modulation scheme.

According to DOCSIS 3.0, the spectrum available for allocation to upstream transmissions is from 5 MHz up to 85 MHz, just over four octaves. Depending upon the number of channels allocated, a cable modem must support a data signal transmission burst with power output (to a 75 Ohm medium, e.g., coaxial cable) per channel up to 53 dBmV or 56 dBmV in S-CDMA mode, and possibly up to 61 dBmV in TDMA mode. Power output from each cable modem is also controlled by the CMTS. In a process called ranging, the CMTS instructs each cable modem to increase or decrease transmission power such that upstream data signals arriving at the CMTS arrive with substantially the same signal levels regardless of which cable modem sent the signals. Cable modems that are further away from the CMTS on the shared medium may need to transmit with higher power to compensate for additional attenuation associated with a physically longer propagation along the length of the cable. Cable modems closer to the CMTS, along the cable, may need to transmit with lower power because their signals travel a shorter distance along the shared medium, causing less attenuation.

Evolution in the cable industry has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range supported by DOCSIS 3.0, covering more than five and a third octaves. In addition to the extended frequency ranges and accordingly expanded bandwidths, DOCSIS 3.1 brings new modulation and coding schemes into the cable data services industry. DOCSIS 3.1 implements orthogonal frequency division multiple access (OFDMA) into the upstream channels, and allows allocation by the CMTS to the CM of a frequency range, rather than individual channels, and within the frequency range there are multiple subcarriers of either 25 kHz or 50 kHz spacing. To allow for backwards compatibility, a CMTS may continue to allocate channels within DOCSIS 3.0 frequency ranges, modulation, and coding schemes. Additionally, full compliance with DOCSIS 3.1 requires support for power output up to 65 dBmV into 75 Ohm loads across the entire spectrum. Cable modem manufacturers may further require higher output signal levels, of, for example, 68 dBmV or higher.

The DOCSIS 3.1 specification also has strict requirements for Noise Figure (NF), Modulation Error Rate (MER) and spurious emissions across the entire spectrum. Conventional cable modems have not been able to meet the DOCSIS 3.1 specifications over the full 5-204 MHz spectrum and have instead implemented only the newer modulation scheme of the DOCSIS 3.1 specification over a conventional spectrum range of up to 42 MHz or up to 85 MHz. In the near future, however, demand will increase to the point that cable modem manufacturers will be required to support the full spectrum of the DOCSIS 3.1 specification from 5-204 MHz.

In addition to the requirement to support power output up to 65 dBmV into 75 Ohms across the entire upstream spectrum from 5-204 MHz with accompanying noise figure, modulation error rate, and spurious emissions limitations, a cable modem also must be capable of adjusting upstream output power to accommodate ranging operations of the CMTS, i.e., to adjust output power as instructed by the CMTS such that the data signals received at the CMTS from all cable modems in the system arrive with substantially the same power. A typical cable modem may provide an output power adjustable in 1 dB steps from about 5 dBmV up to about 64 dBmV, with various noise figure, modulation error ratio, and spurious emission limits, across the DOCSIS 3.0 spectrum with a high end frequency of 42 MHz or 85 MHz. As described above, DOCSIS 3.1 more than doubles this high end frequency to 204 MHz, while maintaining the lower edge of 5 MHz.

Radio Frequency (RF) power amplifier manufacturers for the cable modem industry are challenged to design amplifiers capable of providing adjustable signal output powers spanning 58 dB or more (e.g., 10-68 dBmV at 75 Ohms) across a frequency band spanning more than 5 octaves (e.g., 5-204 MHz), while maintaining stringent noise figure and modulation error ratio requirements across all output signal levels and frequencies. Additionally, at least because cable modems connect to a shared medium, they are desired to behave well in other aspects, such as to present a consistent impedance to the cable to reduce signal reflections, and to limit spurious emissions.

Each of various frequency spectrum allocations made under DOCSIS 3.0 and 3.1 specifies at least one pair of low and high edge frequencies for a transmit range and for a receive range. The terms transmit and receive as used herein are from the perspective of a cable modem. That is, a transmit frequency range is an upstream range, for data signals sent from a cable modem (CM) to a cable modem termination system (CMTS), and a receive frequency range is a downstream range, for data signals sent from the CMTS to one or more CM's.

FIG. 1 is a schematic diagram for data over cable service in a residential environment implemented with a hybrid fiber-coax infrastructure. Shown in FIG. 1 are three distribution branches 100 serving multiple houses, or customer premises 110, each connected by at least one drop 120 from one of the distribution branches 100. Each customer premises 110 has a cable modem connected to a coaxial cable. Customer premises 110 that are connected via the same distribution branch 100 share a coaxial medium 130 in the neighborhood, such that all data signal transmissions on the shared coaxial medium 130 may be observed at, and may have an impact upon, other cable modems connected to the shared coaxial medium 130. In a hybrid fiber-coax system like that shown in FIG. 1, each distribution branch 100 coaxial medium 130 connects to an optical node 140 that converts radio frequency (RF) electrical signals from the coaxial medium 130 to optical signals on a fiber optic cable 150, and vice versa. The fiber optic cable 150 delivers the optical signals to a cable modem termination system (CMTS) 160. For purposes of the disclosure herein, the cable modems may be considered to communicate directly with the CMTS 160 via electrical radio frequency signals on the coaxial medium 130. Beyond the CMTS 160, and as shown for example in FIG. 1, the CMTS 160 may communicate with a regional router 170 and ultimately to a further network 180. Other examples of data over cable services may include other equipment and may provide services to commercial rather than residential customer premises.

Figure 2:
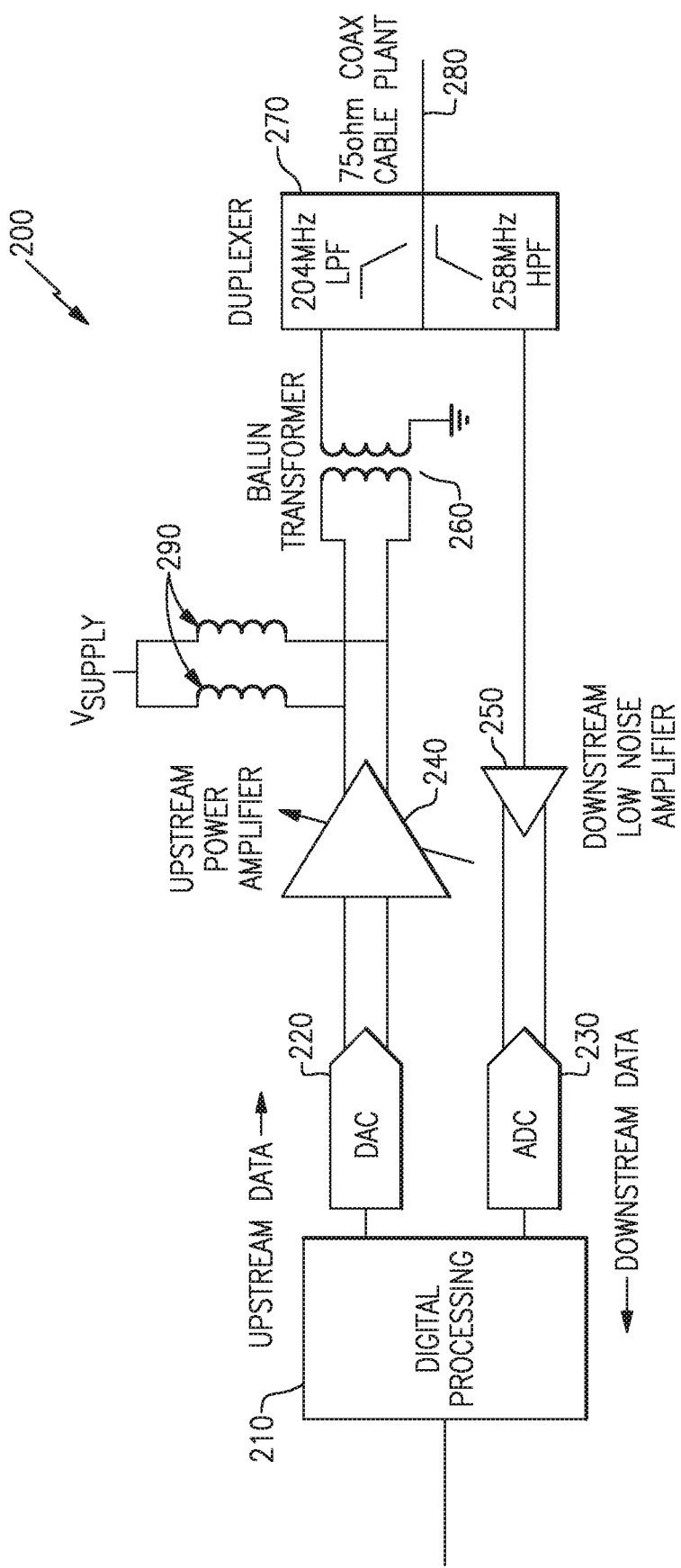
FIG. 2 is a schematic diagram of a cable modem.

FIG. 2 is a simplified schematic diagram of an example of a cable modem. The cable modem 200 transmits upstream data signals to a CMTS 160 (see FIG. 1) and receives downstream data signals from the CMTS 160. The cable modem 200 includes a signal processor 210 that processes received downstream data signals and generates upstream data signals for transmission. The signal processor 210 may operate in a digital domain and the cable modem 200 may further include a digital to analog converter (DAC) 220 that converts the upstream signals into an analog form, and an analog to digital converter (ADC) 230 that converts the downstream signals into digital form. An upstream amplifier 240 amplifies the upstream data signals to a power level sufficient for the upstream data signals to reach the CMTS with enough signal strength for the CMTS to reliably receive the upstream data signals. A downstream amplifier 250 amplifies received downstream data signals (from the CMTS) to a sufficient level for the signal processor 210 to reliably receive the downstream data signals. It should be appreciated that, for clarity, additional circuitry may be included that is not shown, such as up-converters for the transmit side and down-converters for the receive side, for example. The downstream amplifier 250 is typically a low noise amplifier (LNA) configured to sufficiently amplify the relatively low signal level of the received downstream data signal without adding significant noise. The output of the upstream amplifier 240 is coupled through a balun 260 to a duplexer 270 that couples the upstream data signals to a coaxial cable 280, which is further operatively coupled to a shared coaxial medium 130 of FIG. 1. The duplexer 270 also couples the downstream data signals from the coaxial cable 280 to provide the downstream data signals to the downstream amplifier 250. The duplexer 270 may include frequency selective filters to separate the downstream data signals arriving via the coaxial cable 280 from the upstream data signals being provided to the coaxial cable 280. As shown in FIG. 2, the upstream amplifier 240 may be implemented as a differential amplifier having differential inputs (e.g., each of a positive and a negative input, or two inputs accommodating a magnitude difference) and having a differential output (e.g., each of a positive and a negative output, or two outputs accommodating a magnitude difference). Additionally as shown in FIG. 2, the differential sides of one or more internal components of the upstream amplifier 240 may be coupled to a power supply voltage by each of a pair of electrical elements, for example, inductors 290.

According to aspects disclosed herein, the cable modem 200 supports the full upstream frequency range of DOCSIS 3.1 from 5 MHz up to 204 MHz with selectable output signal power controlled in multiple steps. In at least one embodiment, the cable modem 200 and the upstream amplifier 240 support output signal power up to 68 dBmV into a 75 Ohm coaxial cable with at least fifty nine (59) output signal power settings differing by a nominal 1 dB variation between adjacent settings. In some embodiments, the upstream amplifier 240 may include a multi-chip module including a substrate with one or more die to implement various features of the upstream amplifier 240. In some embodiments the upstream amplifier 240 may be included in a module that also includes the downstream amplifier 250.

In some embodiments, the upstream amplifier 240 may provide a combination of amplification and attenuation to provide a plurality of distinct output signal power settings. In one example, the number of output signal power settings is fifty-nine. For example, the output signal power settings may span from a minimum output signal power of 10 dBmV up to 68 dBmV, selectable in nominal 1 dB increments, for example, or may span other output signal powers or may provide alternate selectable increments. In at least one embodiment, the upstream amplifier 240 provides a gain range of −23 dB to +35 dB.

An amplifier, such as the upstream amplifier 240, may be formed as an assembly, e.g., an amplifier assembly, of one or more stages having various functions and may include control components, e.g., a controller, that controls aspects of the stages and may have a communication interface to receive configuration parameters and instructions. The terms amplifier, amplifier assembly, and amplifier system may at times be used interchangeably herein and generally refer to one or more stages coupled to receive an input signal and to provide an output signal varying in signal level or power level. The terms amplifier, amplifier assembly, and amplifier system may at times include control components in combination with the one or more stages.

Figure 3:
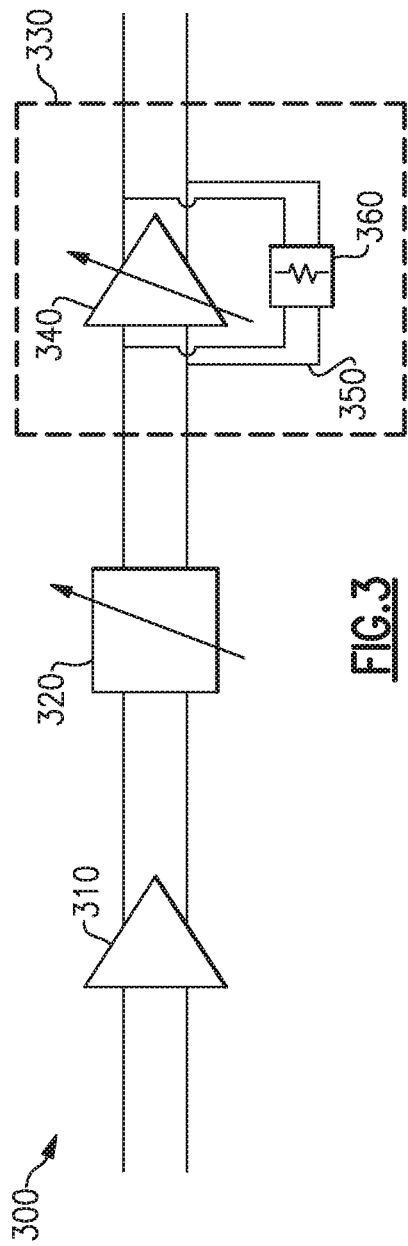
FIG. 3 is a schematic diagram of an example of an amplifier system according to aspects described herein.

FIG. 3 illustrates an amplifier system 300 that is an amplifier assembly including an input stage 310, an adjustable attenuator 320, and an output stage 330. The input stage 310 may be a low noise amplifier (LNA) with fixed gain. The adjustable attenuator 320 may have a range of selectable attenuation levels that may include a 0 dB attenuation level such that, when selected, the adjustable attenuator 320 passes signals from its input to its output substantially without attenuation, and the adjustable attenuator 320 may provide levels of attenuation in, for example, 1 dB steps, up to a maximum attenuation, such as 34 dB of attenuation, for example. The output stage 330 is an adjustable gain element (e.g., variable gain amplifier circuit) including a variable gain amplifier 340 and a bypass path 350. The bypass path 350 may include a fixed attenuator 360. The variable gain amplifier 340 and the bypass path 350, each part of the output stage 330, may be alternatively selected to provide an adjustable gain from, for example, −4 dB up to 20 dB, thus providing a 24 dB range of selectable gain values. With such an output stage 330, in combination with the adjustable attenuator 320 that may provide a 35 dB range, the amplifier system 300 may provide a 59 dB range of overall gain variability.

In at least one embodiment, the input stage 310 provides a fixed 15 dB gain, the adjustable attenuator 320 is a digital switched attenuator (DSA) that provides a range of attenuation from 0 to 34 dB in nominal 1 dB increments, the fixed attenuator 360 is a loss pad that provides 4 dB of attenuation, and the variable gain amplifier 340 provides a selectable gain of 4, 12, or 20 dB by (e.g., activating) one or more unit cells as discussed in more detail below. It is to be appreciated that the amplifier and attenuator components may be designed and constructed to provide any set of amplification gain and/or attenuation values, and embodiments described herein are not limited to the specific examples of gain and attenuation values or ranges described. Additionally, embodiments of an amplifier system may include additional bypass path circuitry providing different attenuation values or no attenuation, e.g., the bypass path 350 may not have the fixed attenuator 360 and instead may pass a signal substantially without attenuation, or there may be no bypass path 350. Additionally, the variable gain amplifier 340 may provide alternate gain values, including negative gain values, and may provide more or less than the gain values explicitly described herein. The various gain values and attenuation values may be used by the system 300 to provide variable output signal levels to accommodate varying applications and operational requirements.

Continuing with the particular above-described embodiment, examples of the amplifier system 300 will be described that provide for gain values ranging from a minimum net gain of −23 dB up to a maximum net gain of +35 dB. The minimum net gain of the amplifier system 300 is provided when the adjustable attenuator 320 is set to provide maximum attenuation (34 dB in this example) and the output stage 330 is configured to route a signal through the bypass path 350 that includes the fixed attenuator 360. The resulting net gain of −23 dB is the combination of 15 dB gain of the input stage 310, −34 dB gain of the adjustable attenuator 320, and −4 dB gain of the fixed attenuator 360.

The maximum net gain of the amplifier system 300 is provided when the adjustable attenuator 320 is set to provide 0 dB of attenuation and the output stage 330 is configured to route a signal through the variable gain amplifier 340 set to provide the maximum available gain (e.g., 20 dB of gain). The resulting net gain of +35 dB is the combination of 15 dB gain of the input stage 310 and 20 dB gain of the variable gain amplifier 340. The adjustable attenuator 320 passes a signal without attenuation (0 dB) when the amplifier system 300 is in the maximum gain operating state. For clarity, examples of the gain values of the input stage 310, the adjustable attenuator 320, and the output stage 330 are shown in Table 1 for the minimum and maximum net gain operating states of the amplifier system 300.

TABLE 1

| Input Stage 310 | Attenuator 320 | Output Stage 330 | Net Gain |
| --- | --- | --- | --- |
| +15 dB | −34 dB | −4 dB | −23 dB |
| +15 dB | 0 dB | +20 dB | +35 dB |

Intermediate gain values, between the minimum and maximum net gain of the amplifier system 300 overall, e.g., gain values between −23 dB and +35 dB in the example discussed above, may be achieved by varying combinations of individual gain values provided by the adjustable attenuator 320 and the output stage 330.

For instance, when the bypass path 350 has a fixed attenuation and the variable gain amplifier 340 has three amplify different modes of operation; the output stage 330 may operate in one of four different modes of operation. In a first mode, which is a bypass mode, a received signal is routed through the bypass path 350 and not routed through the variable gain amplifier 340. In this mode, the signal travels through the fixed attenuator 360, resulting in a 4 dB attenuation applied by the output stage 330, for example. In contrast, during each of the three amplify modes, the signal is routed through the variable gain amplifier 340 and not routed through the bypass path 350. Accordingly, in each of the amplify modes the variable gain amplifier 340 applies a gain to the received signal. The applied gain may vary across each of the amplify modes. In one example of the amplifier system 300 discussed above, in the first amplify mode the variable gain amplifier 340 applies a 4 dB gain to the signal, in the second amplify mode the variable gain amplifier 340 applies a 12 dB gain to the signal, and in the third amplify mode the variable gain amplifier 340 applies a 20 dB gain to the signal. Particular examples of the variable gain amplifier 340 and bypass path 350 are further discussed below with reference to at least FIG. 6A.

Figure 4:
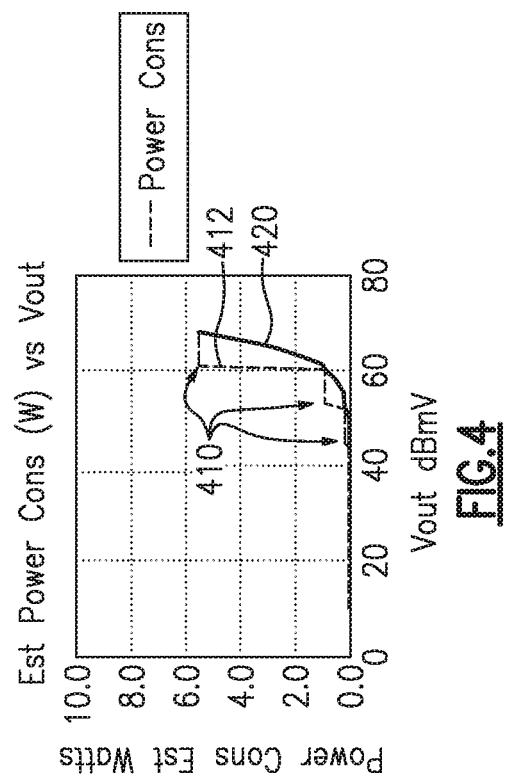
FIG. 4 is a graph of estimated power consumption for an amplifier system according to aspects described herein.

FIG. 4 is a graph of estimated power consumption versus output signal levels (e.g., of the received signal) of the output stage 330 shown in FIG. 3. The steps 410 in the trace 412 represent increasing power requirements, from left to right, of the variable gain amplifier 340 as the output stage 330 changes from the bypass mode, to the first, second, and third amplify modes, respectively. As shown in FIG. 4, the amplifier system 300 has reduced power requirements at lower output signal levels. At least in part, power reductions are achieved for lower desired output signal levels by reducing amplification provided by the variable gain amplifier 340, which is accomplished by disabling one or more unit cells (e.g., consisting of semiconductors, transistors, or other amplifier elements) of the variable gain amplifier 340 when the desired output signal level is relatively low, as discussed in more detail below. In some embodiments, power consumption is further reduced by adjusting an amplifier bias signal (e.g., a bias current or a bias voltage) applied to the unit cells to increase efficiency.

Returning to FIG. 3, the variable gain amplifier 340 may be coupled to a power supply (not shown) that may provide source power to the variable gain amplifier 340 in the form of a bias current. For instance, the bias current may be directed to the unit cells to activate those unit cells. In various examples, the bias current provided to the variable gain amplifier 340 may be varied based on the needs of the variable gain amplifier 340 for a particular signal output level of the amplifier system 300. For example, the first, second, and third amplify modes of the variable gain amplifier 340 may not each require the same amount of bias current to provide the respective gain values (e.g., 4 dB, 12 dB, and 20 dB). Accordingly, in various examples, the bias current may be dynamically controlled (e.g., increased or decreased) as the variable gain amplifier 340 is switched between the amplify modes. Further efficiency may be achieved, in some embodiments, by adjusting the bias current for a particular gain value of the output stage 330 during a given amplify mode. For example, the third amplify mode of the variable gain amplifier 340 may be utilized to provide eight distinct output power levels. Specifically, while the variable gain amplifier 340 is in the third amplify mode (e.g., 20 dB), the adjustable attenuator 320 may be adjusted across eight different attenuation settings of 1 dB, therefore, each resulting in a 12 dB-20 dB range of gain values. Accordingly, while there are eight such settings, for example, in which the variable gain amplifier 340 provides a gain of 20 dB, the bias signal provided to the variable gain amplifier 340 may be adjusted for each of the eight settings, based upon a desired output power level setting being achieved by varying the adjustable attenuator 320.

For a selected amplify mode and/or signal level, an amplifier bias signal may be determined that provides enough power to the variable gain amplifier 340 (e.g., unit cells) to provide the desired output signal level with sufficient linearity and/or noise characteristics, without providing any surplus power. An amplifier bias signal determined necessary for a particular output signal level may be lower than an amplifier bias signal determined necessary for a different output signal level, even for the same gain characteristic of an amplify mode of the variable gain amplifier 340. Each determined value of bias current, e.g., for different desired output signal levels, may be recorded in a storage element, such as a lookup table, a register, or similar, and retrieved by a controller, for example, to control the bias current provided for each desired output signal level. In the example of the amplifier system 300 discussed above, there are a range of amplification and output signal levels for which a signal is routed through the variable gain amplifier 340. When the signal is routed through the variable gain amplifier 340, the variable gain amplifier 340 operates in one of the first, second, or third amplify mode to provide a gain of 4 dB, 12 dB, or 20 dB, respectively. Within any of these three amplify modes, the bias current provided to the variable gain amplifier 340 may be controlled or varied to optimize power consumption for varying output signal levels, thereby reducing power consumption between the amplify modes.

FIG. 4 includes a smooth curve 420 that illustrates power consumption when using an adjusted bias current for each net gain, e.g., for differing output signal level settings. The trace 412 illustrates power consumption of the amplifier system 300 if a bias current is provided at a maximum amount for each amplify mode, and the smooth curve 420 plotted in FIG. 4 is the adjusted power consumption when an adjusted bias current is incorporated as discussed above. It is to be appreciated that while the example of the amplifier system 300 discussed above includes three amplify modes, each of which is used to provide a set of eight overall gain values, and accordingly a set of eight output signal levels, this is merely an example of one set of such values. Other embodiments of an amplifier system in accord with aspects and embodiments described herein may include more or fewer amplify modes with more or fewer gain settings, and various gain values and output signal levels may be provided by one or more amplify or bypass modes.

An amplifier system in accord with aspects and embodiments described herein may be implemented in a number of physical technologies and topologies. As discussed above, an amplifier system may include an input stage amplifier, an adjustable attenuator, a variable gain amplifier, and a bypass path signal path, or any combination or subset of these, implemented in various arrangements and manufactured using various techniques. Any of these components may be implemented in a substrate or in a die and may be designed for and manufactured from various semiconductor materials, such as Silicon (Si), Germanium (Ge), Gallium arsenide (GaAs), for example, using various design technologies, such as complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies.

In at least one embodiment, an amplifier system may include a low noise amplifier implemented on a GaAs ED-pHEMT die, a digital switched attenuator (DSA) implemented on an SOI die, a variable gain amplifier implemented on a BCD-LDMOS die, and a controller implemented on a bulk CMOS die. Each of the dies may be mounted upon or coupled to a substrate with interconnections to each other within the substrate, or by other conducting materials, to convey signals between the various inputs, outputs, and controlled elements of each die, and the set of dies on the substrate may be packaged into a multi-chip module (MCM) with a physical format suitable for incorporation into a device, such as a cable modem, by, for example, mounting and/or soldering to a circuit board.

Figure 5:
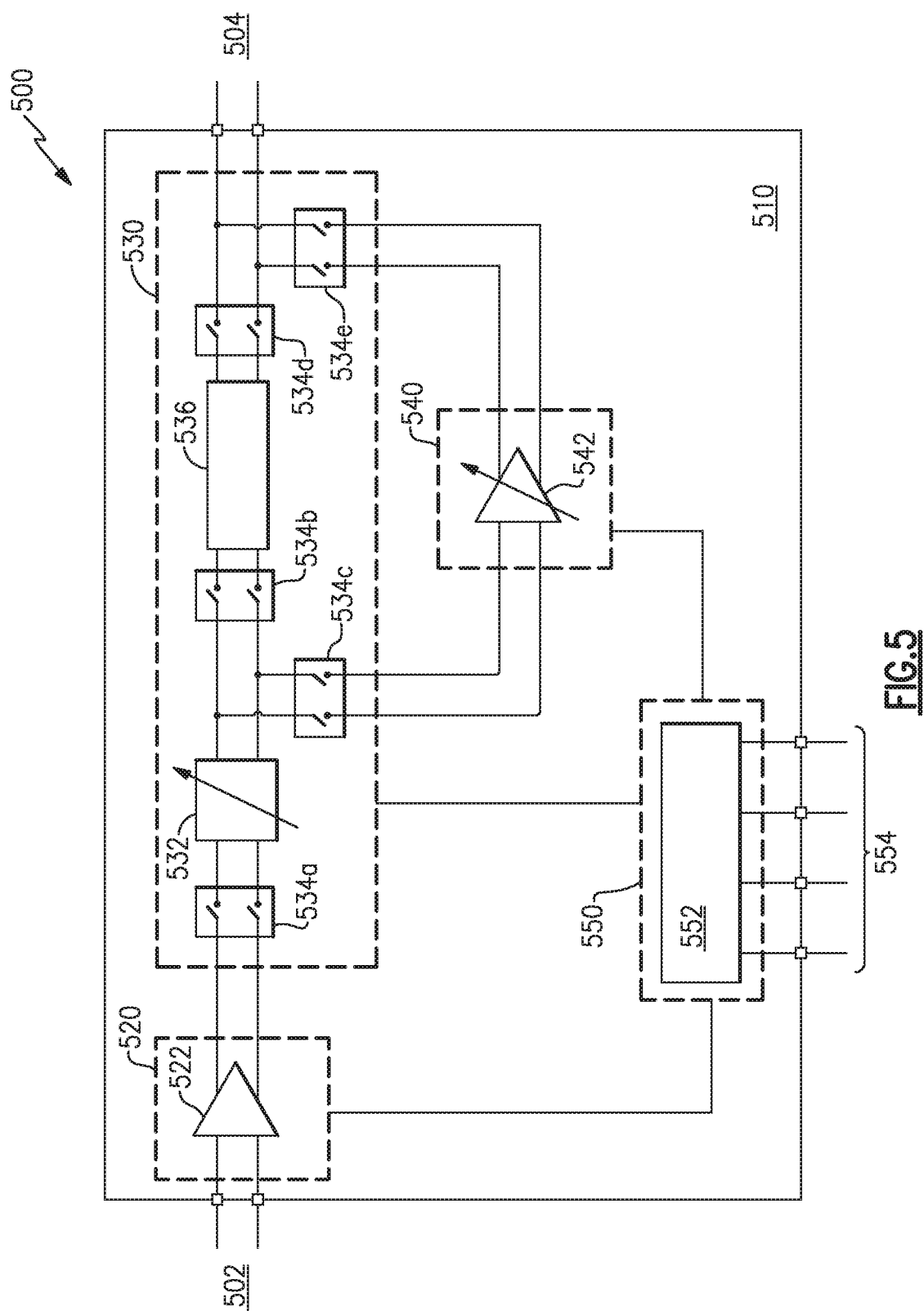
FIG. 5 is a schematic diagram of another example of an amplifier system according to aspects described herein.

FIG. 5 shows an example of an amplifier system 500 implemented as a multi-chip module. In one example, the amplifier system 500 corresponds to the amplifier system 300 shown in FIG. 3. The amplifier system 500 has an input 502 for receiving balanced differential signals and an output 504 for providing balanced differential signals of differing signal levels. The amplifier system 500 includes multiple chip dies, as described individually in more detail below, provided on a substrate 510. A first die 520 is coupled to the input 502 and includes a fixed gain amplifier 522 and which corresponds to the input stage 310 of FIG. 3. A second die 530 is coupled to the output of the fixed gain amplifier 522 and includes an adjustable digital switched attenuator 532 and multiple switches 534a, 534b, 534c, 534d, 534e (collectively "switches 534") that selectively route the signal from the output of the digital switched attenuator 532 through either of a fixed attenuator 536, in a bypass mode, or a third die 540 that includes a variable gain amplifier 542, in an amplify mode, to the output 504. The output of the second die 530 is coupled to the output 504. Portions of the second die 530 and the third die 540 together may form an output stage (e.g., output stage 330 in FIG. 3) that may operate in a bypass mode or in an amplify mode based upon the status of the switches 534.

The switches 534 may be multiple switches as shown or may be fewer switches implemented with, e.g., single-pole double-throw switches that alternately make a connection to one or another signal path. In some embodiments, some of the switches 534 may be configured to enable a signal path upon receiving a particular control signal and others of the switches 534 may be configured to disable a signal path upon receiving a similar control signal. In some embodiments, inverters may be provided such that a single control signal may cause some of the switches 534 to enable a signal path and cause others of the switches 534 to disable a signal path. The switches 534 may be implemented as transistors or any suitable technology.

The amplifier system 500 may also include a fourth die 550 that includes a system controller 552 that provides control signals to components included on one or more of the first, second, and third dies. For example, the system controller 552 may communicate with or control the attenuation settings of the digital switched attenuator 532, control the gain settings of the variable gain amplifier 542, control or adjust a bias current provided to the variable gain amplifier 542 or the fixed gain amplifier 522, and/or control the switches 534 to place the output stage in bypass mode or amplify mode and to establish the overall net gain of the amplifier system 500. The system controller 552 may control the various components based upon instructions it receives via a control interface 554. The amplifier system 500 may have, for example, the specifications described in Table 2.

TABLE 2

| | |
|---|---|
| Frequency Range | 5 MHz to 204 MHz |
| Input Stage | Fixed Gain Amplifier 522 (e.g., Low Noise Amplifier) |
| | Gain: 15 dB (fixed) |
| | Noise Figure: 1 dB |
| | Input IP3: 15 dBm |
| | Output IP3: 30 dBm |
| Adjustable Attenuator | Digital Switched Attenuator 532 |
| | Selectable 0-34 dB attenuation in 1 dB steps |
| Output Stage | Variable Gain Amplifier 542 |
| | Gain: 4, 12, 20 dB (selectable) |
| | Noise Figure: 10, 9, 8 dBm |
| | Input IP3: 30 dBm (all gain settings) |
| | Output IP3: 34, 42, 50 dBm |
| | Bypass Path |
| | 4 dB Loss Pad (e.g., Fixed Attenuator 536) |

Although not shown in FIG. 5, in certain embodiments the amplifier system 500, and corresponding multi-chip module, may further include a receive path amplifier, such as the downstream amplifier 250 illustrated in FIG. 2, for example.

In at least one embodiment, an amplifier system may be provided as a packaged multi-chip module, as described above, with packaging such as an overmold that substantially encapsulates a substrate and various dies and components thereon, and including connectivity to the exterior of the packaging to provide signal and control interconnections. An amplifier system in accord with aspects and embodiments described herein may be provided on a single chip or die and may be packaged into a chip-scale package. Any of an amplifier system, multi-chip module, or chip-scale package as described herein may be used as an upstream amplifier for, e.g., a DOCSIS cable modem, or as a selectable-gain signal amplifier for any suitable application, such as a radio frequency amplifier or part of a front-end module. Component characteristics may be altered to provide an amplifier system in accord with aspects and embodiments described herein to provide amplification across a number of frequency ranges, gain values, output levels, linearity, noise characteristics, and other performance criterion to be suitable for various applications and changing operational parameters.

Figure 6A:
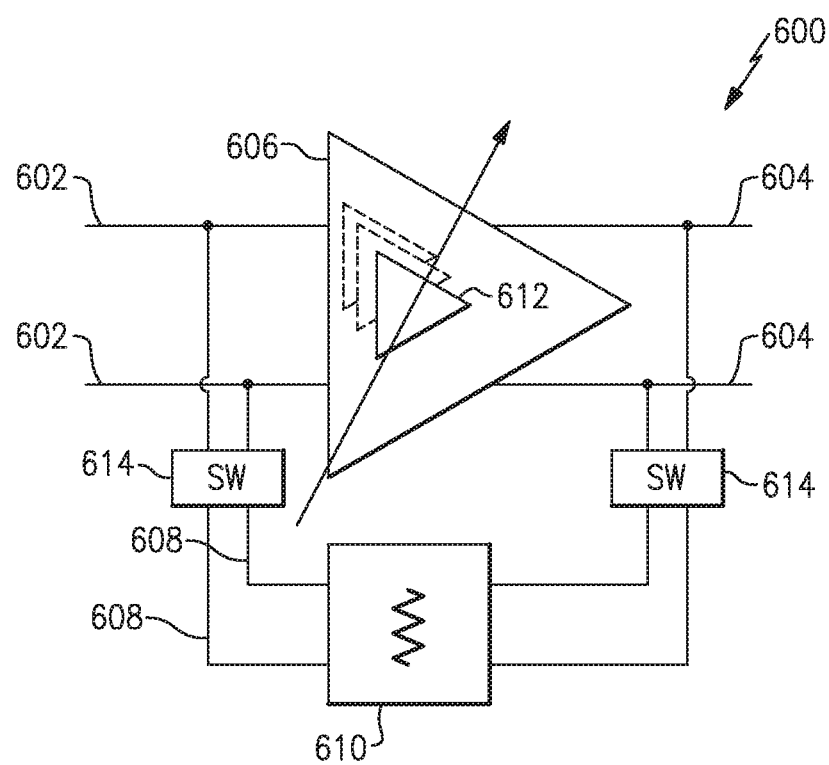
FIG. 6A is a block diagram of an example of a variable gain amplifier circuit according to aspects described herein.

As discussed herein, in certain examples an amplifier system, such as the amplifier system 300 illustrated in FIG. 3 or the amplifier system 500 illustrated in FIG. 5, may include an assembly of stages, one of which may be an output stage including a variable gain amplifier circuit. One particular example of a variable gain amplifier circuit 600 is illustrated in FIG. 6A. The variable gain amplifier circuit 600 may be coupled to other components of the amplifier system 300 shown in FIG. 3, such as the adjustable attenuator 320 and a system output (e.g., via a balun), and may be controlled to provide a broad range of selectable gain values, and, accordingly, output power settings for the full spectrum of the DOCSIS 3.1 specification (i.e., from 5-204 MHz). According to various examples, the gain values of the variable gain amplifier circuit 600 may be dynamically selected, and/or adjusted, based on the settings of the other components of the amplifier system. That is, the gain provided by the variable gain amplifier circuit 600 may be selected or adjusted based on one or more adjustments made to the settings of the input stage and/or the adjustable attenuator. As further discussed herein with reference to at least FIGS. 6-18, the various examples of the variable gain amplifier circuits offer the benefits of high-linearity, low-noise, and high efficiency signal amplification.

In certain examples, the variable gain amplifier circuit 600 may have a signal input 602 coupled to an output of the adjustable attenuator, and a signal output 604 coupled to the system output. The variable gain amplifier circuit 600 includes a variable gain amplifier 606 configured to maintain a substantially constant input-referred linearity across various combinations of the range of gain values and attenuation levels of the associated amplifier system. As discussed herein, input-referred linearity may refer to a measurement of a linearity of the variable gain amplifier 606 as referenced at an input of the variable gain amplifier 606. For instance, in one example the variable gain amplifier 606 may be a high-linearity complementary metal-oxide-semiconductor (CMOS) power amplifier which maintains a substantially constant (e.g., ±1 or 3 dB) input-referred third order intercept point (IIP3) for each of a plurality of amplify modes and substantially across the full spectrum of the DOCSIS 3.1 specification (i.e., from 5-204 MHz). In various implementations, the particular tolerance range of variations in the IIP3 may depend on the particular performance requirements of the variable gain amplifier 606 and associated amplifier system. For instance, in some examples a slight variability in IIP3 may be tolerated to improve the power efficiency of the variable gain amplifier system 600.

FIG. 6A also shows the variable gain amplifier circuit as including a bypass path 608. As illustrated, the signal input 602 may include a differential signal input. Accordingly, the variable gain amplifier 606 may include a pair of corresponding contacts (e.g., conductors) adapted to receive a differential pair of complementary signals from the signal input 602. Similarly, the signal output 604 may include a differential signal output. Accordingly, the variable gain amplifier 606 may also include a second pair of corresponding contacts (e.g., conductors) coupled to the signal output 604. Coupled between the signal input 602 and the signal output 604, the variable gain amplifier circuit 606 may include the bypass path 608, which in the illustration of FIG. 6A includes a fixed attenuator 610. As illustrated, one or more sets of switches 614 in the bypass path 608 may selectively couple the signal input 602 to the signal output 604 through the fixed attenuator 610. As discussed herein, the variable gain amplifier 606 may operate during one of a variety of amplify modes to provide an amplified signal at the signal output 604 based on a signal received at the signal input 602.

Figure 6B:
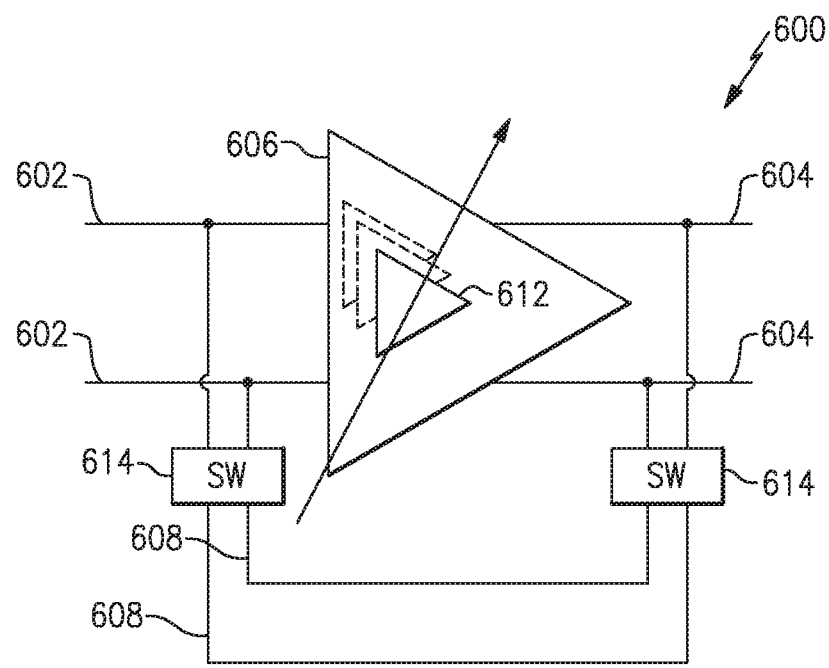
FIG. 6B is a block diagram of another example of a variable gain amplifier circuit according to aspects described herein.

During a bypass mode, the one or more sets of switches 614 couple the signal input 602 to the signal output 604 through the fixed attenuator 610 and the signal received at the signal input 602 is provided directly from the signal input 602 to the signal output 604 through the bypass path 608, thereby avoiding amplification by the variable gain amplifier 606. During the bypass mode, the variable gain amplifier 606 may be turned off to conserve power and improve system efficiency. As illustrated in FIG. 6A, the bypass path 608 may include the fixed attenuator 610, which may attenuate the signal by a desired amount. While the amount of attenuation may be selected based on the performance requirements of the variable gain amplifier circuit 600, in one example, the fixed attenuator 610 may include a loss pad that provides 4 dB of attenuation. In certain examples, the parameters of the fixed attenuator 610 may be selected to achieve a desired input/output impedance of the variable gain amplifier circuit 600. For instance, the fixed attenuator 610 may include a variable resistor having a value selected to achieve a 75 Ohm output, given a 100 Ohm input. In certain other examples, the bypass path 608 may not include the fixed attenuator 610 and instead may pass the signal directly from the signal input 602 to the signal output 604 of the variable gain amplifier circuit 600 during the bypass mode. FIG. 6B illustrates one example of the variable gain amplifier circuit 600 with the fixed attenuator removed from the bypass path 608.

According to various examples, each amplify mode of the variable gain amplifier 606 corresponds to at least one group of unit cells 612 within the variable gain amplifier 606. For example, the variable gain amplifier 606 illustrated in FIG. 6A is shown as having three groups of unit cells, and therefore may operate in one of at least three amplify modes. Each group of unit cells may include at least one unit cell, and each unit cell may have at least one transistor configured to amplify the signal during the corresponding amplify mode. Accordingly, during a given amplify mode, the variable gain amplifier 606 receives the signal and routes the signal through the unit cell(s) of the group corresponding to that amplify mode. In one example, the three amplify modes of the variable gain amplifier 606 may include a low gain mode, a medium gain mode, and a high gain mode, and may each provide a different amount of gain to the received signal. However, in certain other examples more or less than three amplify modes may be implemented. That is, the amplify modes are described herein as including a low gain mode, a medium gain mode, and a high gain mode for the purpose of illustration only and the variable gain amplifier circuit 600 of various embodiments may provide any number of gain values.

Figure 15:
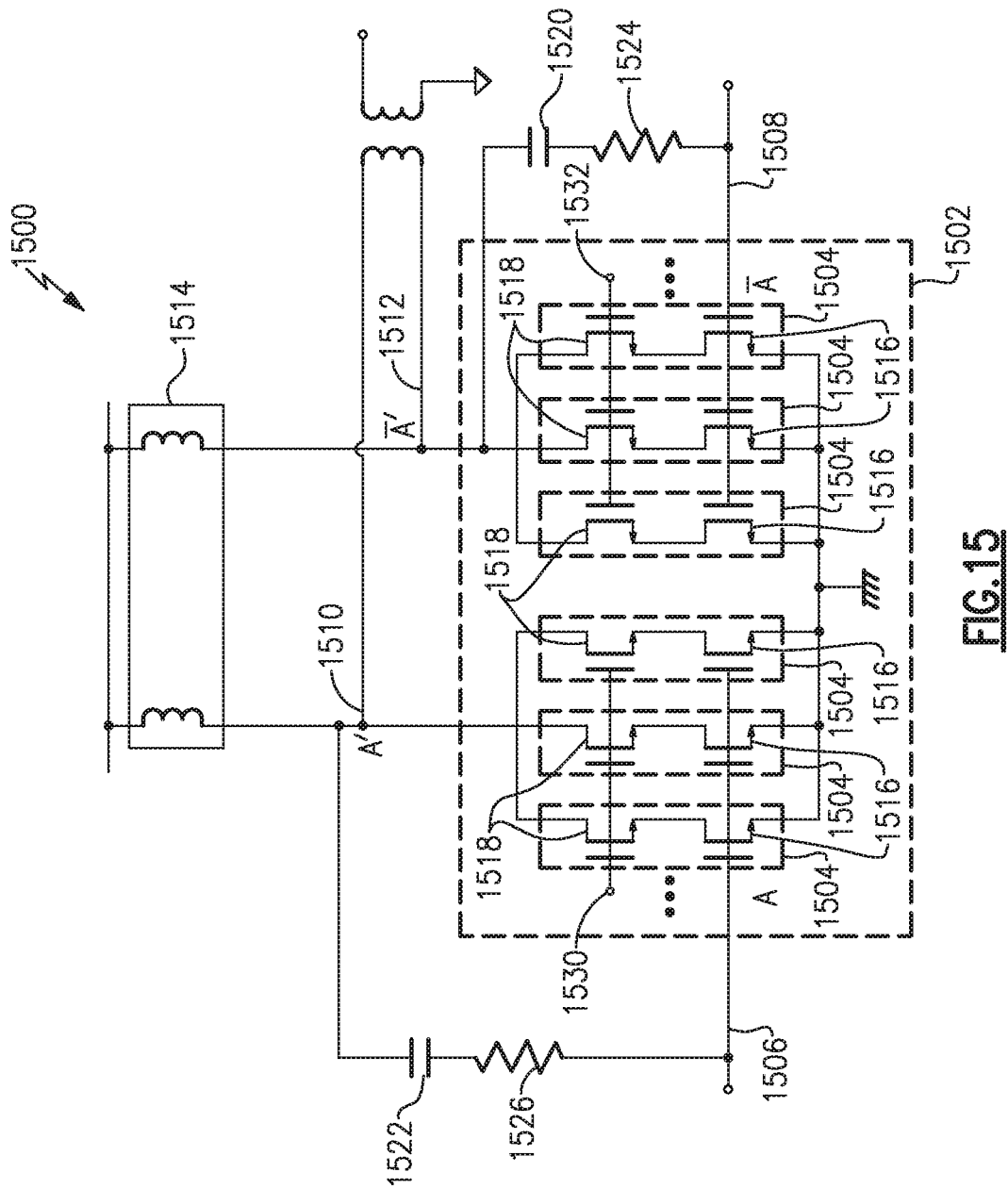
FIG. 15 is a schematic illustration of another example of a variable gain amplifier circuit, according to aspects described herein.

As discussed, during a respective amplify mode, the variable gain amplifier circuit 600 may route the signal through the one or more unit cells of a group of unit cells to apply a positive gain to the signal received at the signal input 602. In a particular example, the variable gain amplifier circuit 600 may provide a gain range of 24 dB, each amplify mode corresponding to an incremental step of 8 dB. Such an example would include a loss of 4 dB from the fixed attenuator 610 during the bypass mode. In the given example, the variable gain amplifier 606 may include 40 unit cells arranged among the three illustrated groups of unit cells. In various examples, the unit cell(s) within a particular group of unit cells may also be included within another of the groups of unit cells. For instance, in the examples where the variable gain amplifier includes a total of 40 unit cells, the low gain mode may correspond to a group of 8 unit cells, the medium gain mode may correspond to a group of 21 unit cells, and the high gain mode may correspond to a group of all 40 unit cells. It is appreciated that the variable gain amplifier 606 may include any number of unit cells (20, 80, 120, etc.), and the number of unit cells may depend on the range of selectable gain values desired and/or the variety of desired amplify modes. That is, the amount of amplify modes, amount of unit cells within a group, and the total amount of unit cells within the variable gain amplifier are provided herein merely for illustrative purposes. As further described below, FIG. 15 illustrates one example of an arrangement of unit cells.

During the low gain mode of operation the variable gain amplifier 606 may provide a total of 4 dB of gain, during the medium gain mode the variable gain amplifier 606 may provide a total of 12 dB of gain, and during the high gain mode the variable gain amplifier 606 may provide a total of 20 dB of gain. Table 3 illustrates one example of the gain (in dB), noise figure (in dB), input-referred third order intercept point (IIP3) (in dB), output-referred third order intercept point (OIP3) (in dB), and estimated Power Consumption (in watts) of an amplifier system (e.g., the amplifier system 300 of FIG. 3) including the variable gain amplifier circuit 600, during the low gain, medium gain, high gain, and bypass modes of operation.

TABLE 3

|  | Gain (dB) | NF (dB) | IIP3 (dBm) | OIP3 (dBm) | Power Consumption (W) |
| --- | --- | --- | --- | --- | --- |
| High Gain Mode | 20 | 8 | 30 | 50 | 5.6 |
| Medium Gain Mode | 12 | 9 | 30 | 42 | 0.89 |
| Low Gain Mode | 4 | 10 | 30 | 34 | 0.14 |
| Bypass Mode | −4 | 4 | inf | inf | 0 |

Figure 7:
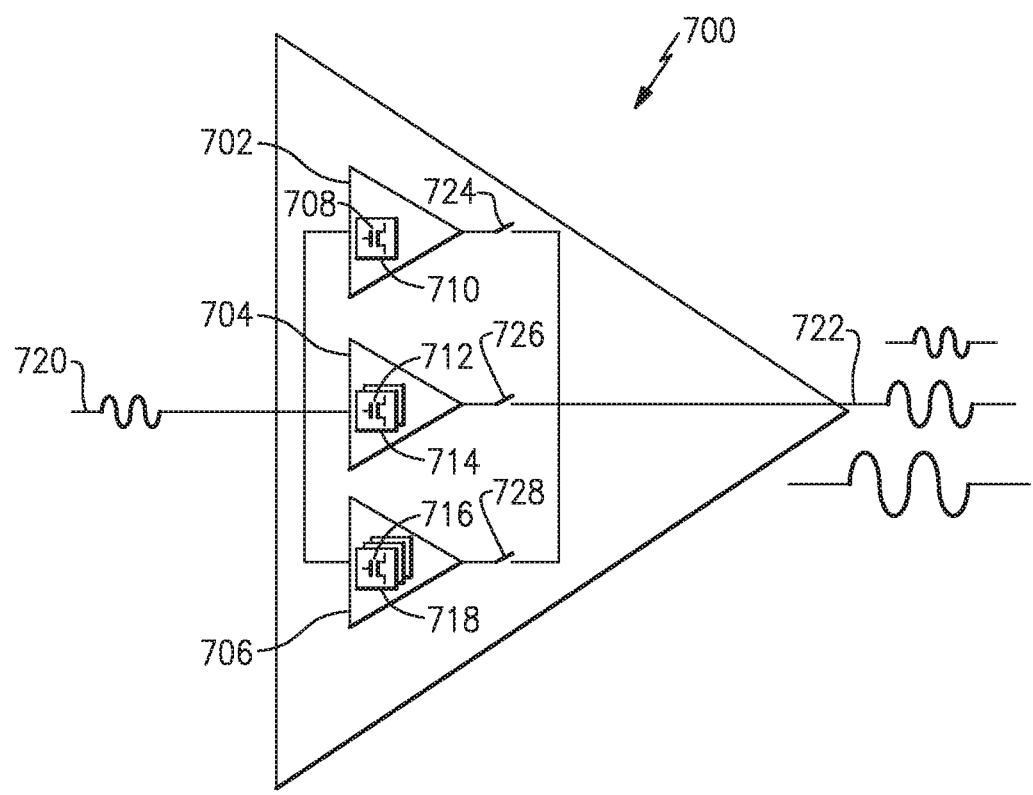
FIG. 7 is a block diagram of an example of a variable gain amplifier according to aspects described herein.

Referring now to FIG. 7, illustrated is one example of a variable gain amplifier 700. For instance, the variable gain amplifier 700 may be the variable gain amplifier 606 illustrated in FIG. 6A. Specifically, FIG. 7 illustrates the variable gain amplifier 700 as including a first group of unit cells 702, a second group of unit cells 704, and a third group of unit cells 706. As discussed herein, each group of unit cells 702, 704, 706 may correspond to an amplify mode of the variable gain amplifier 700 and may be controlled (such as the system controller 552 in FIG. 5) to activate or deactivate responsive to one or more control signals from a controller in communication with the variable gain amplifier 700. That is, the controller may select a given amplify mode from among the plurality of amplify modes by activating one of the groups of unit cells 702, 704, 706 and deactivating the others.

Continuing with the example discussed with reference to FIG. 6A, each group of unit cells 702, 704, 706 may provide an incremental step of 8 dB of gain to a received signal. In various examples, the variable gain amplifier 700 is designed such that the difference in gain between each amplify mode is constant. That is, the difference between the bypass mode and the low gain mode, the low gain mode and the medium gain mode, and the medium gain mode and the high gain mode is the same. As illustrated in FIG. 7, each group of unit cells 702, 704, 706 may include at least one unit cell (e.g., unit cells 710, 714, 718), and each unit cell 710, 714, 718 may include at least one semiconductor device (e.g., transistors 708, 712, 716). Each unit cell 710, 714, 718 within a group may be coupled in parallel, such that, when a group of unit cells is activated, each unit cell within that group collectively behaves as a single transistor to amplify the received signal. In some implementations, such as the variable gain amplifier 700 shown in FIG. 7, each group of unit cells 702, 704, 706 may include a different number of unit cells.

In the low gain mode of operation, the transistors 708 within the unit cells 710 of the first group 702 are biased to provide a total of 4 dB of gain. In the medium gain mode of operation, transistors 712 within the unit cells 714 of the second group 704 are biased to provide an additional 8 dB of gain, for a total gain of 12 dB. Similarly, during the high gain mode of operation, the transistors 716 within the unit cells 718 of the third group 706 are biased to provide another 8 dB of gain, for a total of 20 dB of gain. As discussed in further detail herein, the controller may regulate a current control, which applies one or more bias currents to the transistor(s) (e.g., transistors 708, 712, 716) of a given unit cell to bias the corresponding transistor(s) to amplify the received signal. When combined with the settings of an input stage and an adjustable attenuator (e.g., the input stage 310 and the adjustable attenuator 320 of FIG. 3), the output of the variable gain amplifier 700 may provide a total gain range of −23 dB to +35 dB, in selectable 1 dB increments, to provide an output signal power range of 10 dBmV to 68 dBmV.

In various examples, the one or more transistor(s) 708, 712, 716 of each unit cell 710, 714, 718 may include a field effect transistor (FET), such as a FET manufactured from gallium arsenide (GaAs), gallium nitride (GaN), indium gallium arsenide (InGaAs), or any other suitable material. While in one example, each transistor 708, 712, 716 may be a metal-oxide-semiconductor field-effect transistor, in various examples, the particular type of field effect transistor device may depend on the application and the circuit design requirements. For example, each transistor 708, 712, 716 may include a pseudomorphic high electron mobility transistor (pHEMT). In certain other examples, the one or more transistor(s) 708, 712, 716 of each unit cell 710, 714, 718 may each include a bipolar junction transistor (BJT), or a combination of FETs and BJTs. As illustrated in FIG. 7, each group of unit cells 702, 704, 706 may be coupled to a signal input 720 and a signal output 722. FIG. 7 also illustrates a plurality of unit cell group switches 724, 726, 728 interposed between a respective unit cell group 702, 704, 706 and the signal output 722. Each of unit cell group switches 724, 726, 728 may be controlled to couple or decouple a corresponding unit cell group 702, 704, 706 with the signal output 722.

Figure 8:
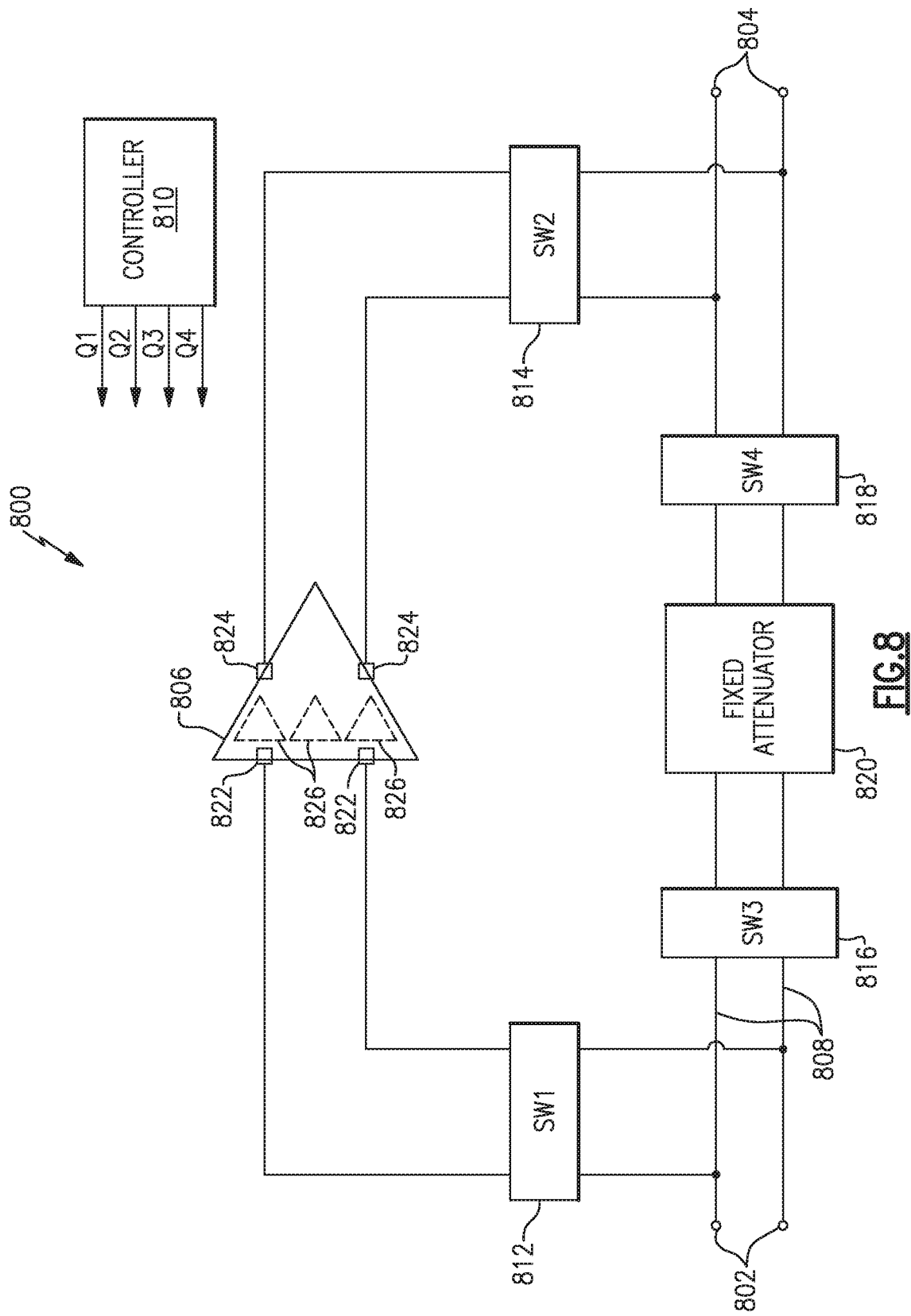
FIG. 8 is a block diagram of an example of a variable gain amplifier assembly according to aspects described herein.

Referring now to FIG. 8, illustrated is an example of a variable gain amplifier assembly 800 according to certain aspects. As illustrated, the assembly 800 may include many of the same components as the variable gain amplifier circuit 600 illustrated in FIG. 6A. For instance, the assembly 800 may include a differential signal input 802, a differential signal output 804, a variable gain amplifier 806, a bypass path 808, a controller 810, and a plurality of switching circuits SW1, SW2, SW3, SW4. In particular, a first switching circuit 812 (SW1) is positioned between the differential signal input 802 and the variable gain amplifier 806, and a second switching circuit 814 (SW2) is positioned between the differential signal output 804 and the variable gain amplifier 806. During each of a plurality of amplify modes of the variable gain amplifier 806, the first switching circuit 812 may be closed to couple the variable gain amplifier 806 to the differential signal input 802, and the second switching circuit 814 may be closed to couple the variable gain amplifier 806 to the differential signal output 804. Accordingly, during each of the plurality of amplify modes, a signal received at the differential signal input 802 is routed to the differential signal output 804 through the variable gain amplifier 806. During a bypass mode, the first switching circuit 812 may be opened to decouple the variable gain amplifier 806 from the differential signal input 802, and the second switching circuit 814 may be opened to decouple the variable gain amplifier 806 from the differential signal output 804.

As further illustrated in FIG. 8, a third switching circuit 816 (SW3) is positioned between fixed attenuator 820 and the differential signal input 802, and a fourth switching circuit 818 (SW4) is positioned between the fixed attenuator 820 and the differential signal output 804. Accordingly, the third and fourth switching circuits 816, 818 may be closed to couple the differential signal input 802 and the differential signal output 804 through the fixed attenuator 820 during the bypass mode. During the plurality of amplify modes, the third and fourth switching circuits 816, 818 may be opened to decouple the fixed attenuator 820 from the differential signal input 802 and the differential signal output 804. Each of the plurality of switching circuits 812, 814, 816, 818 may include a set of switches which is under the operational control of the controller 810. For example, the controller 810 may provide one or more control signals (Q1, Q2, Q3, Q4) to open or close each set of switches. As discussed with reference to at least the variable gain amplifier circuit 600 of FIG. 6A, the variable gain amplifier 806 may include a first pair of contacts 822 corresponding to the differential signal input 802 and a second pair of contacts 824 corresponding to the differential signal output 804, as well as a plurality of unit cell groups 826 each corresponding to one of the plurality of amplify modes.

Figure 9:
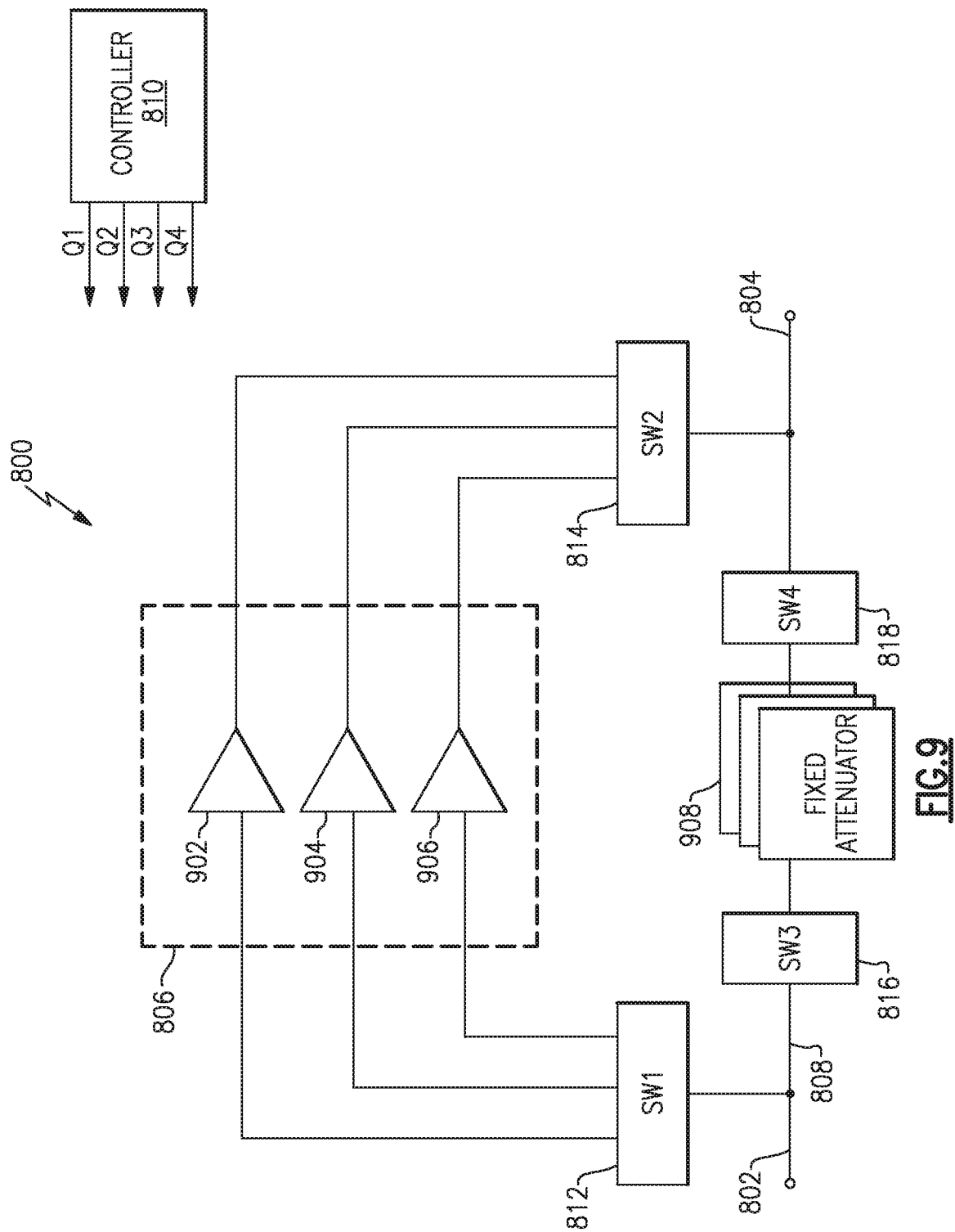
FIG. 9 is a block diagram of another arrangement of the variable gain amplifier assembly illustrated in FIG. 8, according to aspects described herein.

While illustrated in FIG. 8 as including a single variable gain amplifier 806 having a plurality of unit cell groups 826, in certain other examples, the variable gain amplifier 806 may be implemented as a plurality of separate invariable gain amplifiers, each invariable gain amplifier being configured to provide a predetermined gain to the received signal. FIG. 9 illustrates one example of such an arrangement.

In FIG. 9, the variable gain amplifier 806 includes a first invariable gain amplifier 902 corresponding to a first amplify mode (e.g., a low gain mode), a second invariable gain amplifier 904 corresponding to a second amplify mode (e.g., a medium gain mode), and a third invariable gain amplifier 906 corresponding to a third amplify mode (e.g., a high gain mode). Each of the first, second, and third invariable gain amplifiers 902, 904, 906 may be selectively coupled to the differential signal input 802 through the first switching circuit 812, and each of the first, second, and third invariable gain amplifiers 902, 904, 906 may be coupled to the differential signal output 804 through the second switching circuit 814. Accordingly, each of the invariable gain amplifiers 902, 904, 906 may provide the same functionality as one of the unit cell groups 826 illustrated in FIG. 8.

Moreover, while illustrated in FIG. 8 as including a single fixed attenuator 820, in certain other examples, the variable gain amplifier assembly 800 may include a plurality of fixed attenuators 908. Each fixed attenuator 908 may have different parameters from the other fixed attenuators 908 and may be coupled in parallel with the other fixed attenuators 908 between the differential signal input 802 and the differential signal output 804, as illustrated. For instance, each of the fixed attenuators 908 may be a loss pad that provides a different amount of signal attenuation when compared to the other fixed attenuators 908 (e.g., 2 dB, 4 dB, 8 dB, etc.). According to certain examples, the controller 810 may dynamically select from between the plurality of fixed attenuators 908 and control the third switching circuit 816 and the fourth switching circuit 818 to decouple the remaining fixed attenuators 908 from the differential signal input 802 and the differential signal output 804 during the bypass mode. Accordingly, in certain examples the variable gain amplifier assembly 800 may dynamically adjust the fixed attenuation applied by the bypass path 808 during the bypass mode of operation.

Figure 10:
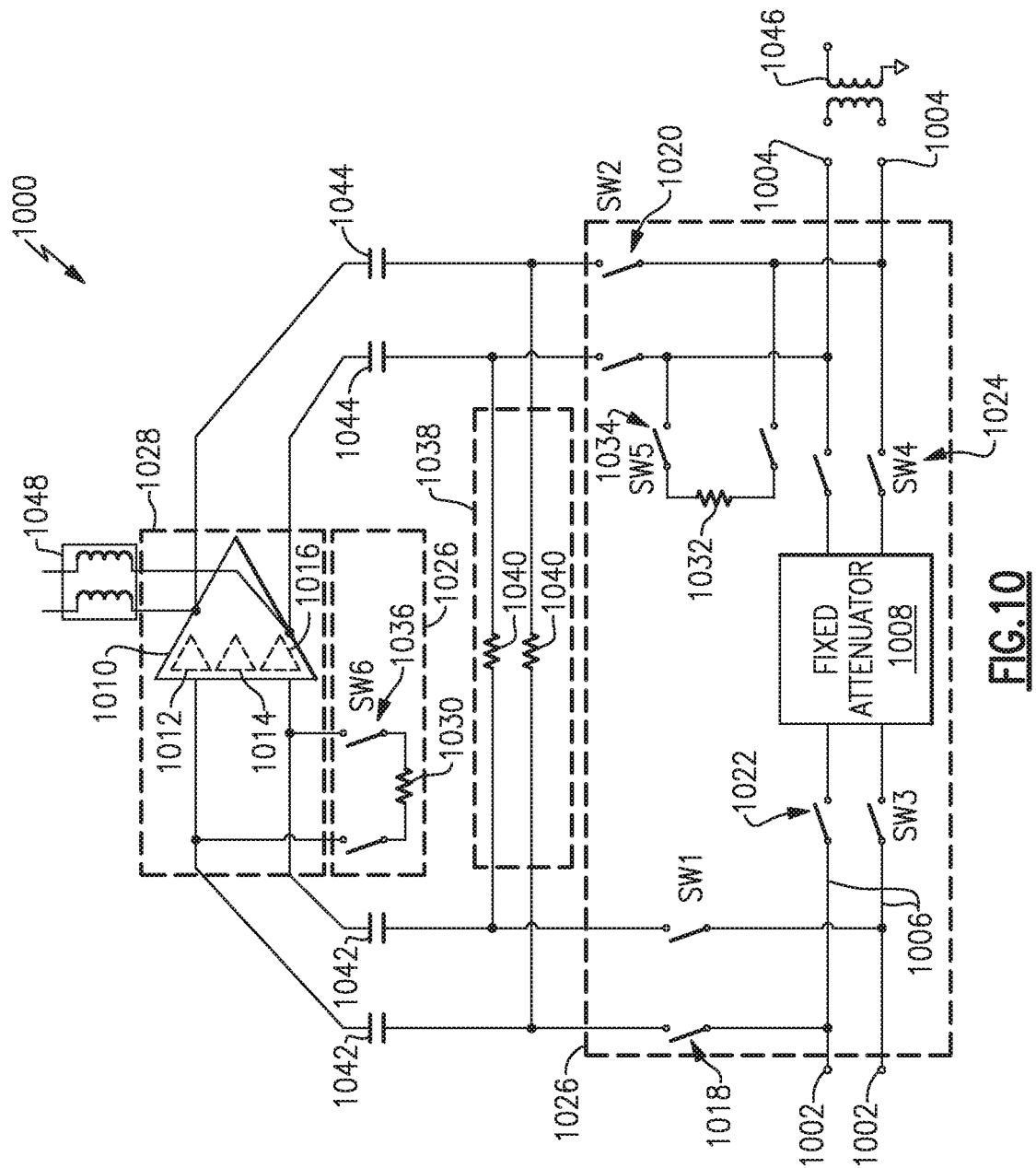
FIG. 10 is a schematic illustration of an example of a variable gain amplifier circuit according to aspects described herein.

Referring now to FIG. 10, illustrated is an example of a variable gain amplifier circuit 1000 according to certain embodiments. The variable gain amplifier circuit 1000 may include a signal input 1002, a signal output 1004, a bypass path 1006 including a fixed attenuator 1008, and a variable gain amplifier 1010 including a plurality of unit cell groups (e.g., low gain unit cell group 1012, medium gain unit cell group 1014, and high gain unit cell group 1016), among other components. As illustrated in FIG. 10, a first set of switches 1018 (collectively SW1) couples the variable gain amplifier 1010 to the signal input 1002 of the variable gain amplifier circuit 1000, and a second set of switches 1020 (collectively SW2) couples the variable gain amplifier 1010 to the signal output 1004 of the variable gain amplifier circuit 1000. A third set of switches 1022 (collectively SW3) couples the signal input 1002 to the bypass path 1006, and a fourth set of switches 1024 (collectively SW4) couples the bypass path 1006 to the signal output 1004. The fixed attenuator 1008 may be interposed between the third set of switches 1022 and the fourth set of switches 1024, as illustrated in FIG. 10. Each of the sets of switches 1018, 1020, 1022, 1024 may include a SOI (silicon on insulator) switch integrated in a first die 1026, which may include a SOI die. In contrast, the variable gain amplifier 1010 may be integrated in a second die 1028, which may include a bipolar complementary metal-oxide semiconductor/double-diffused metal-oxide semiconductor (BCD) laterally diffused metal-oxide semiconductor (LDMOS) die. Each of the dies 1026, 1028 may be mounted upon or coupled to a substrate with interconnections to each other within the substrate, or by other conducting materials, to convey signals between the various inputs, outputs, and controlled elements of each die.

However, as discussed above, any of these components may be implemented in any suitable substrate or die and may be designed for and manufactured from various semiconductor materials, such as Silicon (Si), Germanium (Ge), Gallium arsenide (GaAs), for example, using various design technologies, such as complementary metal-oxide semiconductor (CMOS), Silicon-on-Insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies.

As further illustrated in FIG. 10, in certain examples the variable gain amplifier circuit 1000 may include an input resistor 1030 interposed between a pair of contacts at an input of the variable gain amplifier 1010. Similarly, the circuit 1000 may include an output resistor 1032 interposed between a pair of contacts at an output of the variable gain amplifier 1010. In FIG. 10, the output resistor 1032 is coupled to each contact with a respective switch, collectively, a fifth set of switches 1034 (SW5). The input resistor 1030 is also coupled to each contact with a respective switch, collectively, a sixth set of switches 1036 (SW6). As illustrated in FIG. 10, each of the fifth and sixth sets of switches 1034, 1036 may also include a SOI switch disposed on the first die 1026. However, in other examples, the fifth and sixth sets of switches 1034, 1036 may alternatively be implemented on the second die 1028. In certain examples, the input resistor 1030 and the output resistor 1032 are used to adjust the input and output impedance, respectively, of the variable gain amplifier circuit 1000 such that an input/output impedance network is not necessary. That is, in certain examples a value of the input resistor 1030 and the output resistor 1032 are selected such that the variable gain amplifier circuit 1000 does not experience any input/output losses during the amplify modes. In at least one example, the value of the input resistor 1030 is selected to achieve a 100 Ohm input and the value of the output resistor 1032 is selected to achieve a 75 Ohm output.

In certain examples, the variable gain amplifier circuit 1000 further includes a feedback network 1038 coupled between the signal input 1002 and the signal output 1004 of the variable gain amplifier circuit 1000, in parallel with the variable gain amplifier 1010. For instance, in FIG. 10 the feedback network 1038 is a resistive feedback network including at least one feedback resistor 1040 coupled between the input 1002 and the output 1004. In this manner, the variable gain amplifier 1010 and the feedback network 1038 operates in a manner similar to an operational-amplifier. In certain examples, the feedback resistor 1040 (shown as a pair of feedback resistors 1040) may include a variable resistor. The feedback network 1038 may be controlled to stabilize the input-referred linearity of the variable gain amplifier 1010 during each of the plurality of amplify modes. For instance, the variable resistor may be adjusted for each of the amplify modes to maintain a substantially constant input-referred third order intercept point (IIP3) for each of a plurality of amplify modes. In certain other examples, the variable resistor may be replaced with a plurality of feedback resistors 1040, at least one for each amplify mode. In such an example, the at least one feedback resistor 1040 corresponding to an amplify mode may be switched into the feedback network 1038 during that amplify mode. The feedback network 1038 may be implemented on the first die 1026, the second die 1028, or off-die.

As also shown in FIG. 10, in certain examples the variable gain amplifier circuit 1000 may include one or more input capacitors 1042 coupled to the variable gain amplifier 1010 and one or more output capacitors 1044 coupled to the variable gain amplifier 1010. The input capacitors 1042 and output capacitors 1044 may function as a DC blocking network, and may be used to isolate DC levels between the first die 1026 and the second die 1028. The signal output 1004 of the variable gain amplifier circuit 1000 may be coupled to a system output, for instance through the balun transformer 1046 illustrated in FIG. 10. FIG. 10 further shows a power source 1048 coupled to the variable gain amplifier 1010 through a set of inductors. The power source 1048 may supply one or more bias currents (or voltages) to control the unit cell(s) of the illustrated unit cell groups 1012, 1014, 1016.

Figure 11:
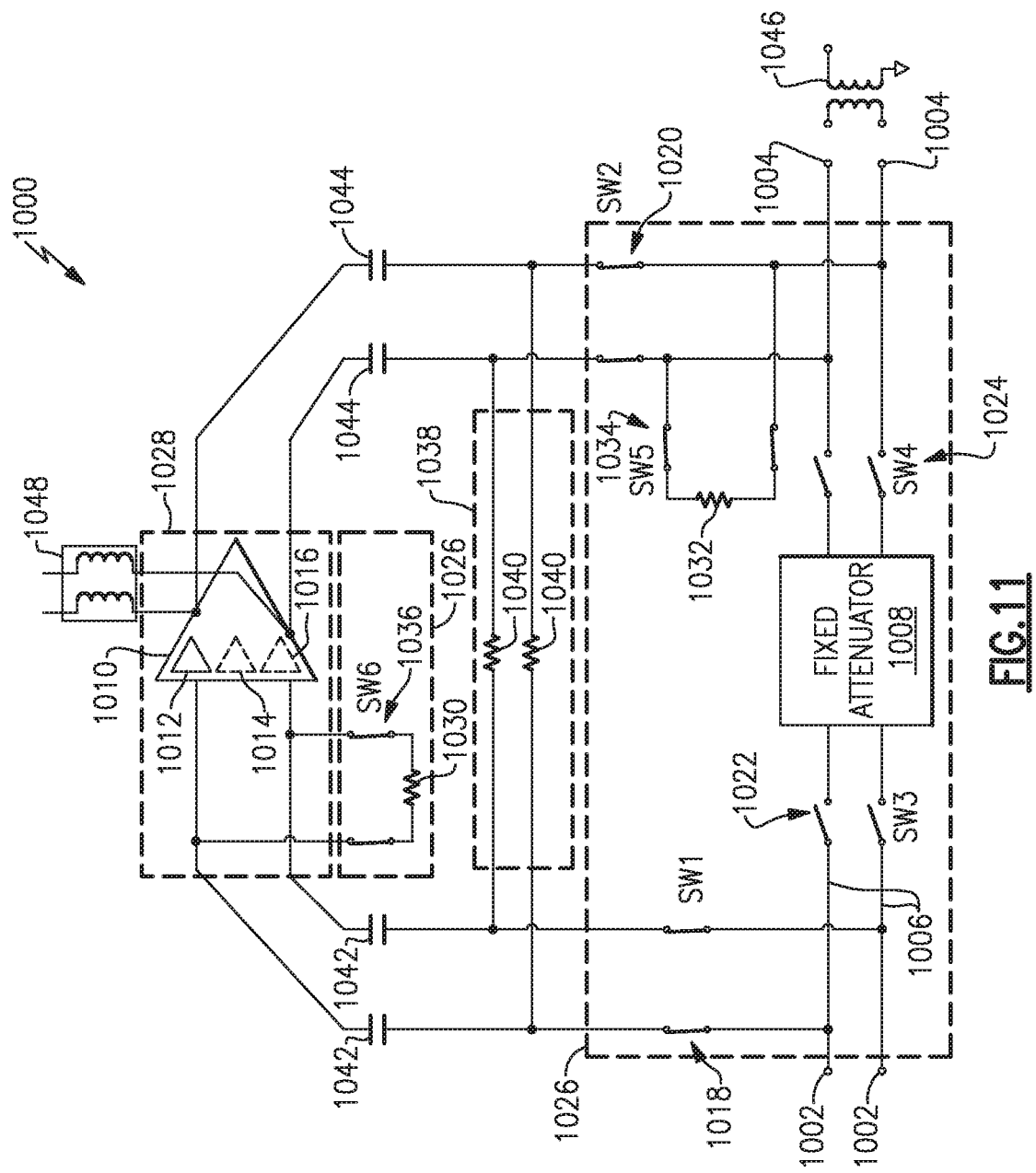
FIG. 11 is a schematic illustration of the variable gain amplifier circuit of FIG. 10 during a low gain mode of operation, according to aspects described herein.

Turning now to FIG. 11, illustrated is one example of the variable gain amplifier circuit 1000 illustrated in FIG. 10 during a low gain amplify mode of the variable gain amplifier 1010. During the low gain mode of operation, the sets of switches 1022, 1024 are open to disconnect the bypass path 1006 from the signal input 1002 and the signal output 1004, and the sets of switches 1018, 1020 are closed to route the received signal from the signal input 1002 to the signal output 1004 through the variable gain amplifier 1010. In the low gain mode, the unit cells (e.g., the one or more transistors) of the low gain unit cell group 1012 are biased to amplify the signal received at the signal input 1002. During the low gain mode of operation, the set of switches 1036 are closed to couple the input resistor 1030 between the contacts at the input of the variable gain amplifier 1010. Similarly, the set of switches 1034 are closed to couple the output resistor 1032 between the contacts at the output of the variable gain amplifier 1010.

Figure 12:
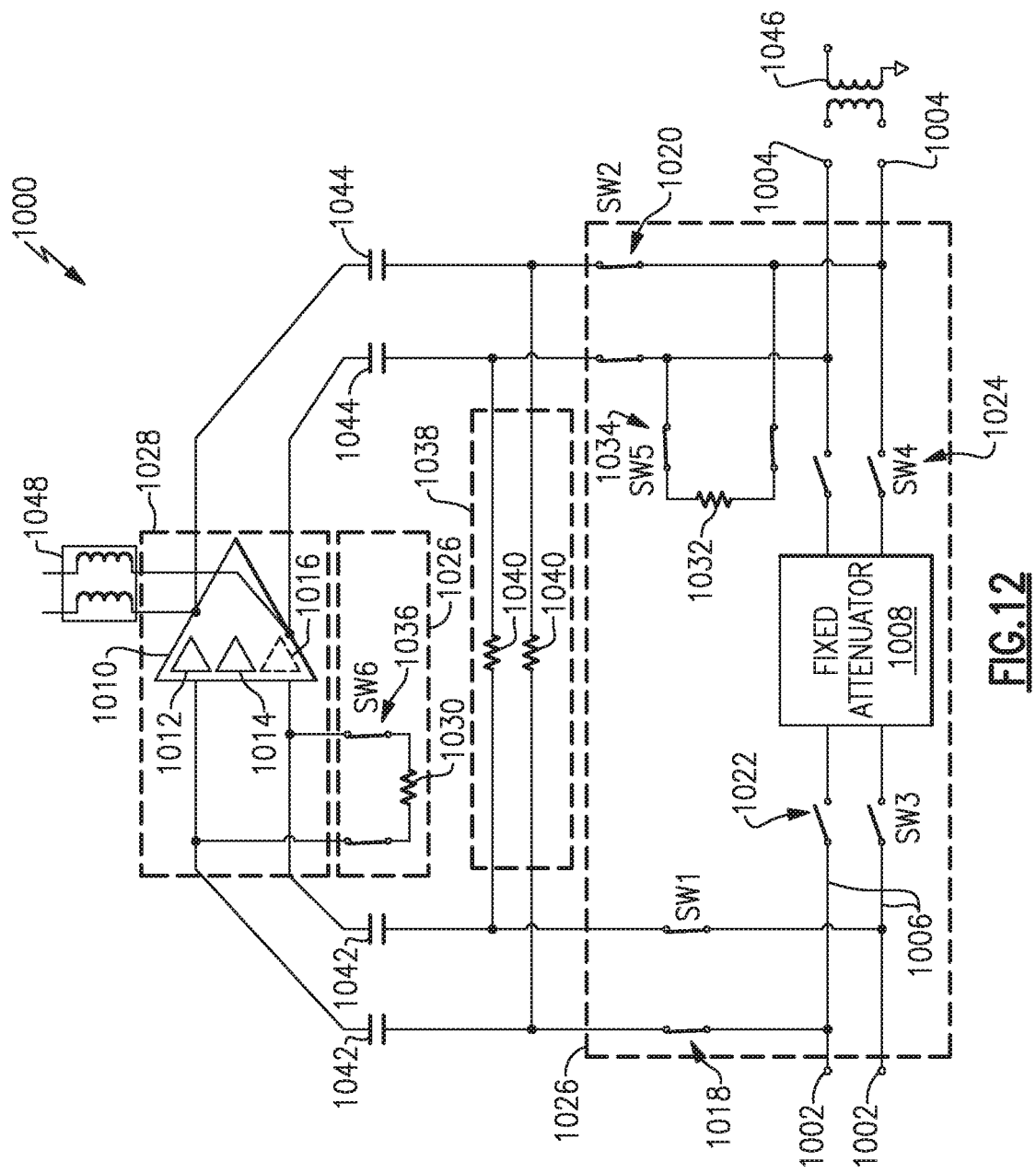
FIG. 12 is a schematic illustration of the variable gain amplifier circuit of FIG. 10 during a medium gain mode of operation, according to aspects described herein.

Turning now to FIG. 12, illustrated is one example of the variable gain amplifier circuit 1000 illustrated in FIG. 10 during a medium gain amplify mode of the variable gain amplifier 1010. During the medium gain mode of operation, the sets of switches 1022, 1024 are open to disconnect the bypass path 1006 from the signal input 1002 and the signal output 1004, and the sets of switches 1018, 1020 are closed to route the received signal from the signal input 1002 to the signal output 1004 through the variable gain amplifier 1010. In the medium gain mode, the unit cells of the medium gain unit cell group 1014 are biased to amplify the signal received from the signal input 1002. In particular, in certain examples, during the medium gain mode the unit cells of the medium gain unit cell group 1014 may include the unit cells of the low gain unit cell group 1012 and an additional set of unit cells. However, in certain other examples, the unit cells of the medium gain unit cell group 1014 may be separate and distinct from the unit cells of the low gain unit cell group 1012. During the medium gain mode of operation, the set of switches 1036 is closed to couple the input resistor 1030 between the contacts at the input of the variable gain amplifier 1010. Similarly, the set of switches 1034 is closed to couple the output resistor 1032 between the contacts at the output of the variable gain amplifier 1010.

Figure 13:
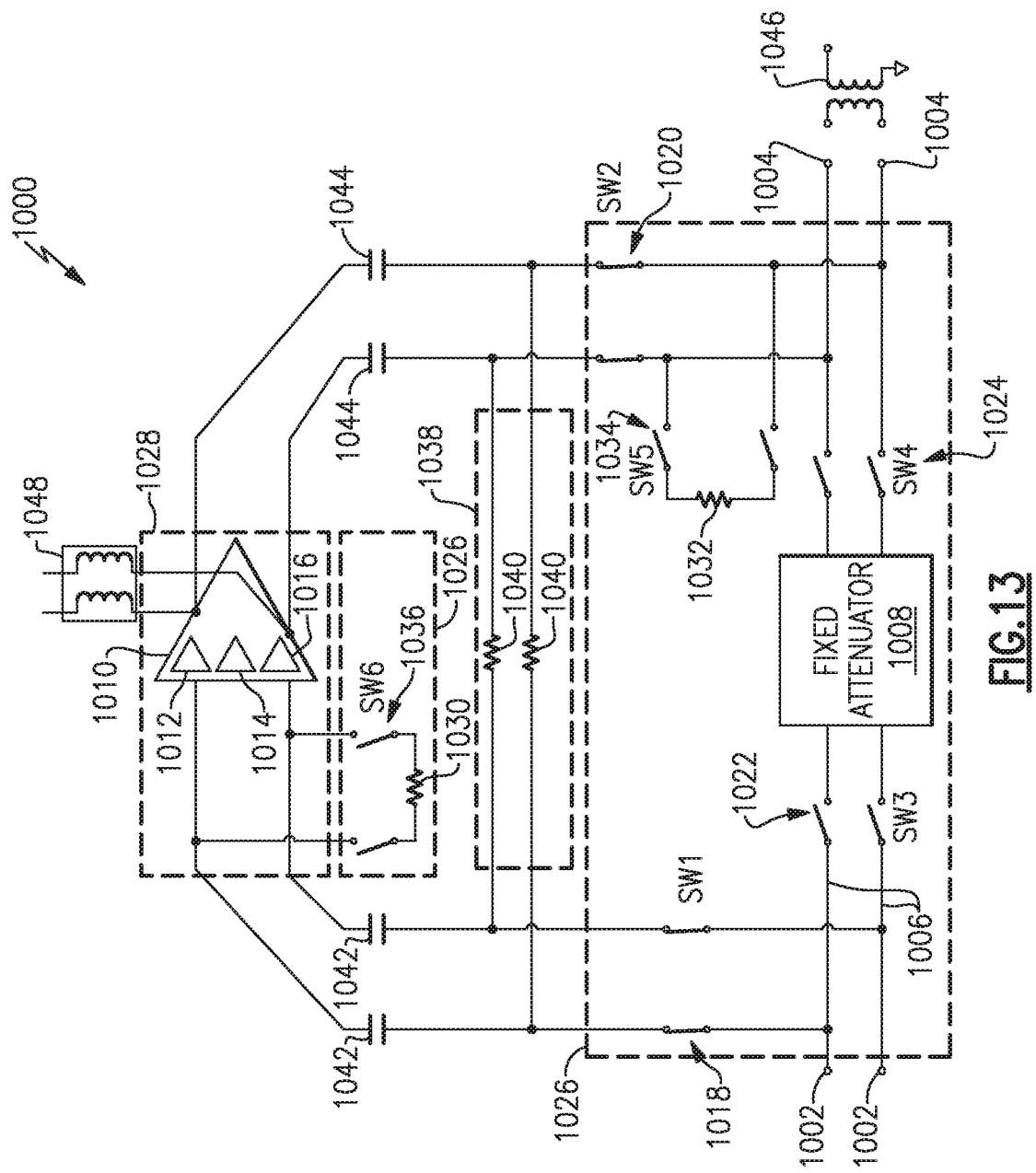
FIG. 13 is a schematic illustration of the variable gain amplifier circuit of FIG. 10 during a high gain mode of operation, according to aspects described herein.

Turning now to FIG. 13, illustrated is one example of the variable gain amplifier circuit 1000 illustrated in FIG. 10 during a high gain amplify mode of the variable gain amplifier. During the high gain mode of operation, the sets of switches 1022, 1024 are open to disconnect the bypass path 1006 from the signal input 1002 and the signal output 1004, and the sets of switches 1018, 1020 are closed to route the received signal from the signal input 1002 to the signal output 1004 through the variable gain amplifier 1010. In the high gain mode, the unit cells of the high gain group of unit cells 1016 are biased to amplify the signal received from the signal input 1002. In particular, during the high gain mode the unit cells of the high gain unit cell group 1016 may include the unit cells of the low gain unit cell group 1012, the medium gain unit cell group 1014, and an additional set of unit cells. However, in certain other examples, the unit cells of the high gain unit cell group 1016 may be separate and distinct from the unit cells of the low gain unit cell group 1012 and/or the medium gain unit cell group 1014. During the high gain mode of operation, the set of switches 1036 are open to decouple the input resistor 1030 between the contacts at the input of the variable gain amplifier 1010. Similarly, the set of switches 1034 are open to decouple the output resistor 1032 between the contacts at the output of the variable gain amplifier 1010.

Figure 14:
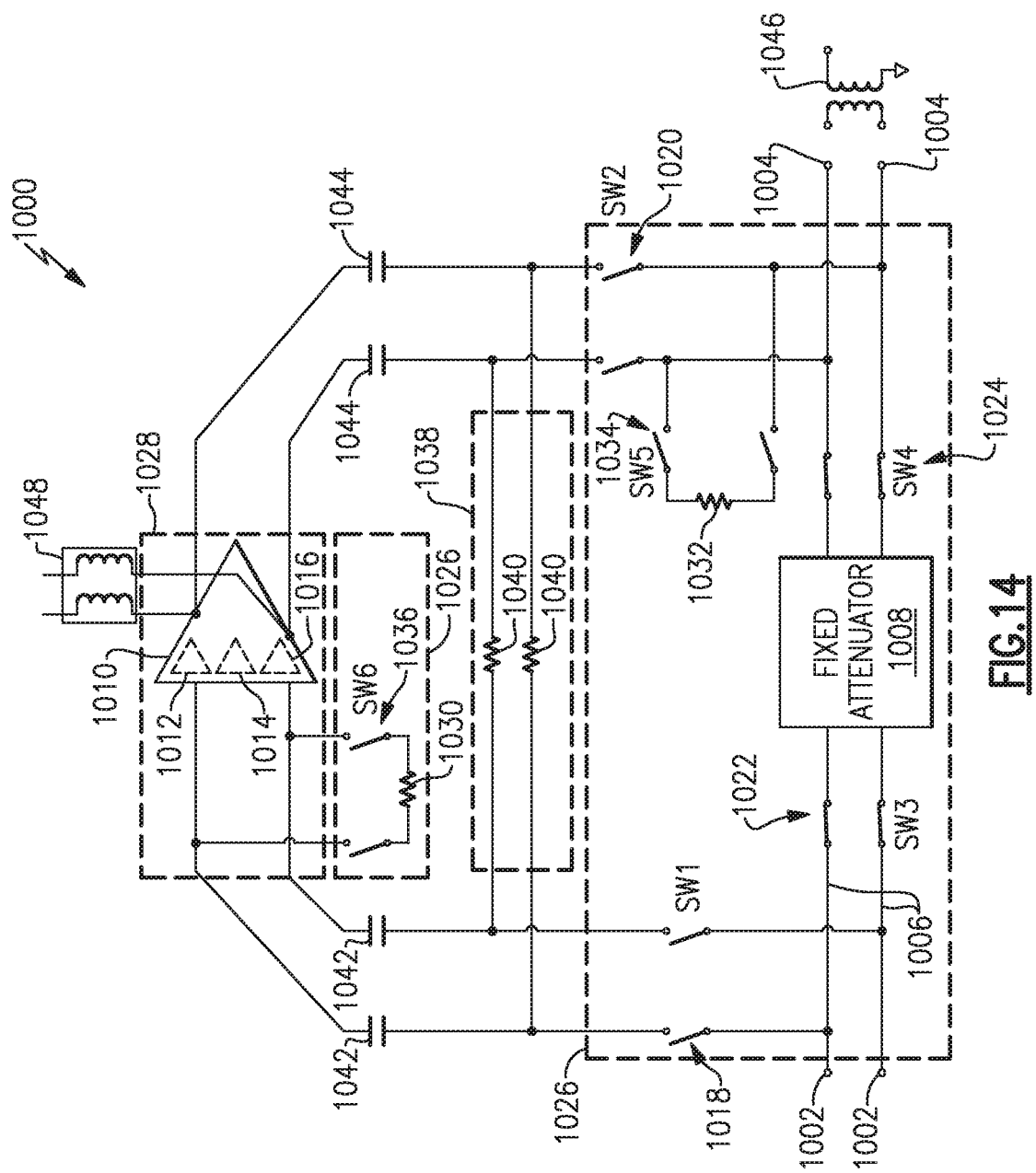
FIG. 14 is a schematic illustration of the variable gain amplifier circuit of FIG. 10 during a bypass mode of operation, according to aspects described herein.

Turning now to FIG. 14, illustrated is one example of the variable gain amplifier circuit 1000 illustrated in FIG. 10 during the bypass mode of operation. During the bypass mode of operation, the sets of switches 1018, 1020 are open to disconnect the variable gain amplifier 1010 from the signal input 1002 and the signal output 1004, and the sets of switches 1022, 1024 are closed to route the received signal from the signal input 1002 to the signal output 1004 through the bypass path 1006. Accordingly, during the bypass mode the variable gain amplifier 1010 may be turned off to improve power consumption (e.g., no bias current is applied to the transistor(s) of each unit cell within the variable gain amplifier 1010). As also illustrated in FIG. 14, during the bypass mode of operation the signal is routed along the bypass path 1006 and through the fixed attenuator 1008 to attenuate the received signal. In the bypass mode, the set of switches 1034 is open to decouple the output resistor 1032 between the contacts at the output of the variable gain amplifier 1010.

In various examples, each of the sets of switches 1018, 1020, 1022, 1024 may be operated in a synchronized manner during one or more of the bypass mode, the low gain amplify mode, the medium gain amplify mode, and the high gain amplify mode. For instance, in one example, the sets of switches 1022, 1024 may be synchronized to decouple the differential signal input 1002 and the differential signal output 1004 from the fixed attenuator 1008 during any of the low gain amplify mode, the medium gain amplify mode, and the high gain amplify mode. Similarly, the sets of switches 1018, 1020 may be synchronized to decouple the variable gain amplifier 1010 between the differential signal input 1002 and the differential signal output 1004 during the bypass mode. In various other examples, each of the sets of switches 1018, 1020, 1022, 1024 may be operated in other synchronized manners as will be apparent to one of ordinary skill in the art given the benefit of this disclosure.

As discussed herein, in various examples each unit cell group 1012, 1014, 1016 of the variable gain amplifier 1010 may consist of a plurality of unit cells, each unit cell including one or more transistor(s). FIG. 15 illustrates an example of a variable gain amplifier circuit 1500 including a variable gain amplifier 1502 having a plurality of unit cells 1504. For example, the variable gain amplifier 1502 illustrated in FIG. 15 may be the variable gain amplifier 606 shown in FIG. 6A or the variable gain amplifier 1010 shown in FIGS. 10-14. In FIG. 15, the plurality of unit cells 1504 are coupled between an input 1506, 1508 (e.g., A, $\overline{A}$) and an output 1510, 1512 (e.g., A', $\overline{A}$') of the variable gain amplifier 1502. While only three unit cells 1504 are shown for each side of the variable gain amplifier 1502 differential input/output, it is appreciated that any suitable number of unit cells 1504 may be included. For instance, 40 unit cells may be used in each side of the differential input/output of the variable gain amplifier 1502 for a total of 80 unit cells. In FIG. 15, a first group of the unit cells (e.g., a low gain unit cell group) may include one unit cell 1504, a second group of the unit cells (e.g., a medium gain unit cell group) may include two unit cells 1504, and a third group of the unit cells (e.g., a high gain unit cell group) may include all three illustrated unit cells 1504.

While each unit cell 1504 is illustrated as including a pair of series transistors (e.g., shown as field-effect transistors (FETs)), any suitable number of transistors may be included within an individual unit cell 1504. As shown, each unit cell 1504 may include a cascode amplifier coupled in parallel with each of the other unit cells 1504. According to at least one example, each cascode amplifier may include a common-source input stage coupled to a common-gate output stage. The common-source input stage is coupled to the respective input 1506, 1508, and the common-gate output stage is coupled to the respective output 1510, 1512. For instance, FIG. 15 illustrates the common-source input stage as a common-source N-channel FET 1516 having a gate coupled to the respective input 1506, 1508, a source coupled to ground, and a drain coupled to the common-gate output stage. The common-gate output stage is illustrated in FIG. 15 as a common-gate N-channel FET 1518 having a gate coupled to a fixed voltage (e.g., biased to a fixed voltage via shown nodes 1530, 1532), a source coupled to the drain of the common-source N-channel FET 1516, and a drain coupled to the respective output 510, 512. While each cascode amplifier is shown in FIG. 15 as including a pair of N-channel FETs, each cascode amplifier may alternatively include a pair of P-channel FETs, BJTs, or a combination of FETs and BJTs.

As further discussed above with reference to at least the variable gain amplifier circuit 1000 illustrated in FIGS. 10-14, in many examples, the variable gain amplifier circuit 1500 may include one or more input capacitors and one or more output capacitors. Input capacitors and output capacitors may be used as a DC blocking network, for example. In FIG. 15, the input capacitors and output capacitors are collectively illustrated by capacitors 1520 and 1522. As further illustrated in FIG. 15, in various examples, the variable gain amplifier circuit 1500 includes a feedback network coupled between the input 1506, 1508 and the output 1510, 1512 of the variable gain amplifier 1502, and in parallel with the variable gain amplifier 1502. For instance, in FIG. 15 the feedback network includes at least one feedback resistor 1524, 1526. In certain examples, the feedback resistor 1524, 1526 may include a variable resistor and may be controlled to stabilize the input-referred linearity of the variable gain amplifier 1502 during each of a plurality of amplify modes.

It is appreciated that activation or deactivation of the one or more unit cells 1504 of the variable gain amplifier 1502 may result in a change in the power consumption of the variable gain amplifier circuit 1500, as discussed above. For instance, when the variable gain amplifier 1502 reduces gain (e.g., switches from a high gain mode to a medium gain mode), the unit cells 1504 corresponding to the high gain mode may be deactivated, and the power consumption of the variable gain amplifier 1502 (and associated amplifier system) may decrease. Accordingly, aspects and examples discussed herein provide the benefit of increased efficiency when compared to typical fixed gain amplifiers, where the power consumption remains constant regardless of the desired gain. In various examples, the power used to bias the unit cells 1516 corresponding to one of the amplify modes is derived from a power source 1514. FIG. 15 shows the power source 1514 coupled to the variable gain amplifier 1502 through a set of inductors.

Figure 16:
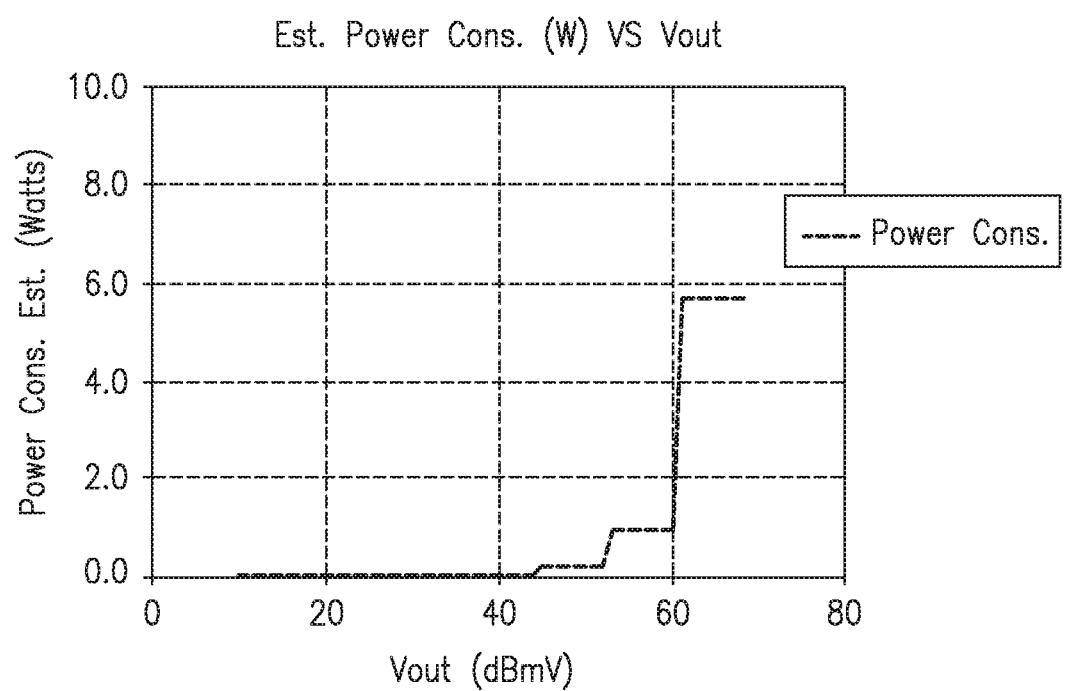
FIG. 16 is a plot of the estimated power consumption of an amplifier system including the variable gain amplifier circuit of FIG. 15, according to aspects described herein.

FIG. 16 illustrates one example of the estimated power consumption (in watts) of an amplifier system including the variable gain amplifier circuit 1500 of FIG. 15 as the variable gain amplifier 1502 is switched from the bypass mode, to the low gain mode, to the medium gain mode, and finally, to the high gain mode. As further discussed herein, between each one of these amplify mode transitions, there may be one or more additional attenuation steps performed by other components of a related system, such as the adjustable attenuator 320 illustrated in FIG. 3 (e.g., one or more 1 dB step).

Accordingly, in certain examples the variable gain amplifier circuit 1500 may include a current control which regulates a bias current provided to the transistor(s) of each unit cell 1504 based on an amplitude of the signal received at the signal input 1506, 1508 and the selected amplify mode of the variable gain amplifier 1502. In particular, for a given output signal level, a bias current may be determined that provides enough power to a unit cell to provide the desired output signal level with sufficient linearity and/or noise characteristics without providing any surplus power. Accordingly, a bias current determined necessary for a particular output signal level may be lower than a bias current determined necessary for a different output signal level, even for the same gain value of an amplify mode of the variable gain amplifier 1502. For instance, a bias current for an amplify mode may be higher when no attenuation is provided by the adjustable attenuator than when the adjustable attenuator is providing attenuation. In such an example, the current control may reduce the bias current responsive to a decrease in the amplitude of the signal (e.g., an increase in attenuation), and may increase the bias current responsive to an increase in the amplitude of the signal (e.g., decrease in attenuation). Such an arrangement further improves the power efficiency of the variable gain amplifier circuit 1500.

Figure 17:
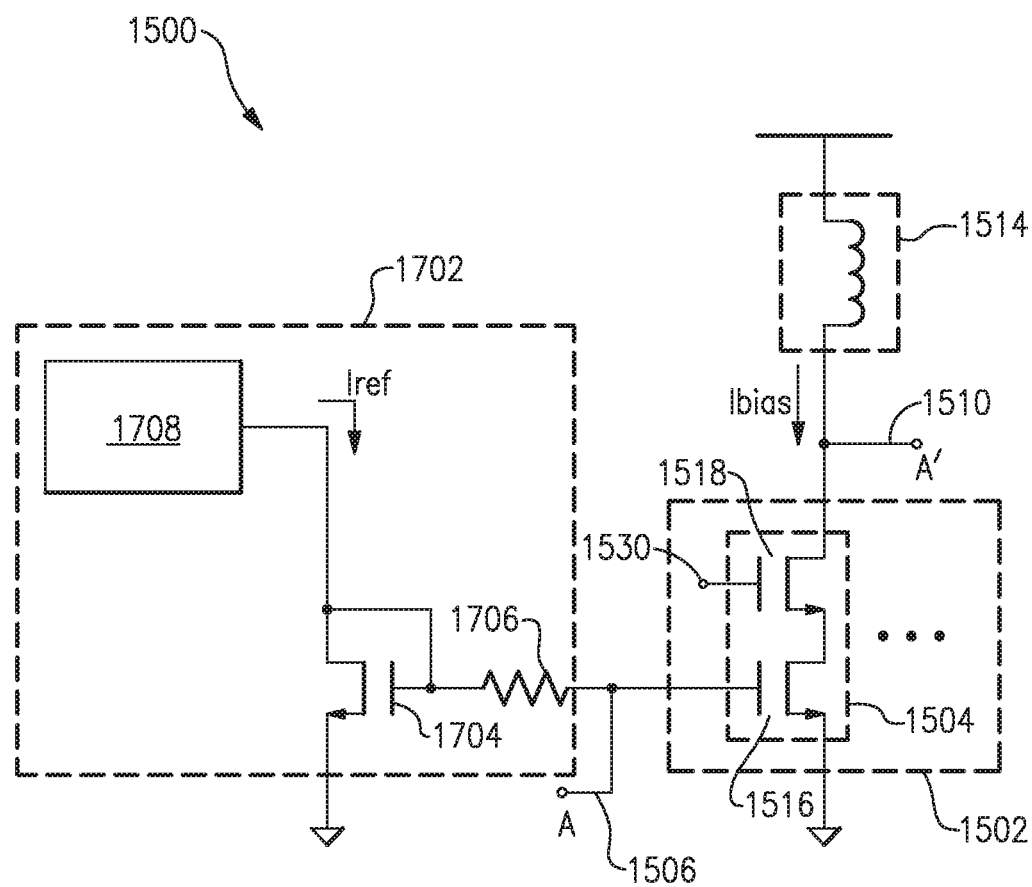
FIG. 17 is a schematic illustration of an example of a current control for the variable gain amplifier circuit of FIG. 15, according to aspects described herein.

FIG. 17 illustrates one example of a current control circuit 1702 that may be used to regulate the bias current provided to the unit cells 1504 (e.g., the cascode amplifier) of the circuit 1500 illustrated in FIG. 15. In particular, FIG. 17 illustrates the current control circuit 1702 coupled to only a single unit cell 1504 for the convenience of the illustration. It is appreciated that in various examples, the current control circuit 1702 may be coupled in a similar manner to each unit cell 1504 of the variable gain amplifier 1502. The input/output capacitor 1522 and the feedback resistor 1526 have also been removed in the illustration of FIG. 17 for the convenience of illustration.

As illustrated in FIG. 17, with continuing reference to the variable gain amplifier circuit 1500 of FIG. 15, the current control circuit 1702 may include a current mirror circuit that is configured to control the bias current (Ibias) provided to the unit cells 1504 by copying a reference current (Tref) through a reference transistor 1704. The reference current may be provided by any suitable current source 1708, such as a Current Analog to Digital Converter (IDAC). In various examples, the reference transistor 1704 may include a FET, such as the illustrated N-channel FET. In FIG. 17, the drain of the reference transistor 1704 is coupled to the current source 1708, the source of the reference transistor 1704 is coupled to ground, and the gate of the reference transistor 1704 is coupled via a reference resistor 1706 to the unit cell(s) 1504 of the variable gain amplifier 1502. Specifically, the reference resistor 1706 is interposed between the gate of the reference transistor 1704 and the gate of the common-source N-channel FET 1516 of each unit cell 1504. In FIG. 17, the drain and gate of the reference transistor 1704 are tied. In various examples, the parameters of the reference transistor 1704 are selected to substantially match the parameters of the common-source N-channel FET 1516 (e.g., the reference transistor 1704 and the common-source N-channel FET 1516 are both the same type of transistor) and, accordingly, the bias current will mirror the reference circuit. As such, in various examples, the bias current is controlled by adjusting (e.g., increasing or decreasing) the reference current.

In particular examples, the appropriate reference current for a given signal amplitude may be determined by a controller (not shown) in communication with the current control circuit 1702. For instance, the controller may provide one or more control signals to the current source 1708 to adjust the reference current and, therefore, adjust the bias current applied to the transistors of the unit cells 1504, based on an amplitude of the signal received at the variable gain amplifier 1502 and a current amplify mode of the variable gain amplifier 1502. As discussed, in various embodiments a level of attenuation applied by the adjustable attenuator may also affect the amplitude of the signal received at the variable gain amplifier 1502. Accordingly, in particular examples the controller may also determine the appropriate bias current directly based on an attenuation setting of the adjustable attenuator.

In various embodiments, the particular bias current(s) for a given state of operation may be predetermined and stored in a reference table, such as a look-up table. For example, the minimum bias current required to meet the performance levels (e.g., maximum modulation error ratio (MER)) for each 1 dB step of gain may be measured and stored in the look-up table. The controller may use the look-up table to determine the appropriate bias current for a given condition during the operation of the variable gain amplifier 1502. The look-up table may include any array that replaces a runtime computation with an indexing operation. For example, the bias current look-up table may include an array of pre-calculated bias current values indexed and stored in static program storage.

Figure 18:
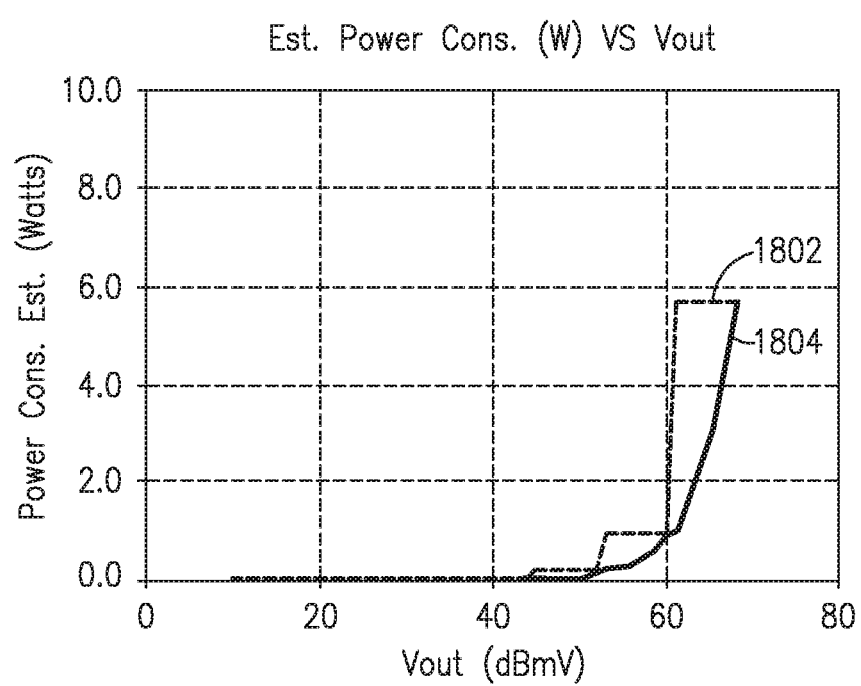
FIG. 18 is another plot of the estimated power consumption of the amplifier system including the variable gain amplifier circuit of FIG. 15, according to aspects described herein.

Accordingly, the variable gain amplifier circuit 1500 may be optimized to reduce the bias current applied to the one or more unit cells 1504 (i.e., the transistor(s) of the unit cells) as the gain is reduced by the adjustable attenuator (e.g., attenuation is increased). Such an operation further reduces the power consumption of the system, as illustrated in the plot of FIG. 18. In FIG. 18, a first trace 1802 represents the estimated power consumption (in watts) of an amplifier system including the variable gain amplifier 1502 as the variable gain amplifier 1502 is switched from the bypass mode, to the low gain mode, to the medium gain mode, and to the high gain mode. In comparison, a second trace 1804 represents the estimated power consumption during similar amplify mode transitions while implementing the bias control techniques described herein. As shown, controlling the bias source in such a manner "smooths" the power consumption plot improving the power consumption of the variable gain amplifier 1502 (and associated amplifier system) at each amplify mode, as discussed above. While FIG. 17 illustrates one circuit for controlling the operation of the variable gain amplifier 1502, in various other examples other circuits and techniques may be used.

Though the elements of several views of the drawings herein may be shown and described as discrete elements in a block diagram and may be referred to as "controllers" or "control circuitry," unless otherwise indicated, the elements may be implemented as one of, or a combination of, analog circuitry, digital circuitry, or one or more microprocessors and/or application-specific integrated circuits (ASICs) executing software instructions. For example, the software instructions may include digital signal processing (DSP) instructions. For instance, in various examples a controller includes at least a processor, data storage, and one or more interfaces for system components. The processor may be coupled to the data storage and the one or more interfaces, and may be configured to perform a series of instructions that result in manipulated data stored and retrieved from the data storage.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A variable gain amplifier assembly having a signal input and a signal output, the variable gain amplifier assembly comprising:
   a variable gain amplifier including a plurality of unit cell groups, each unit cell group of the plurality of unit cell groups including at least one unit cell having at least one transistor, the variable gain amplifier configured to apply a different gain to a signal received at the signal input during each of a plurality of amplify modes, each of the plurality of amplify modes corresponding to at least one unit cell group of the plurality of unit cell groups;
   a feedback network coupled in parallel with the variable gain amplifier between the signal input and the signal output, the feedback network having a resistance; and
   a controller configured to select one of the plurality of amplify modes for the variable gain amplifier based on at least an amplitude of the signal received at the signal input and to adjust the resistance of the feedback network based on the selected amplify mode to stabilize an input-referred linearity of the variable gain amplifier during the selected amplify mode.

2. The variable gain amplifier assembly of claim 1 wherein each of the plurality of amplify modes provides a different gain to the signal received at the signal input.

3. The variable gain amplifier assembly of claim 2 wherein each of the plurality of unit cell groups includes at least one unit cell having a transistor configured to amplify the signal received at the signal input.

4. The variable gain amplifier assembly of claim 3 wherein each of the plurality of unit cell groups includes a different number of unit cells.

5. The variable gain amplifier assembly of claim 3 wherein the at least one unit cell is a cascode amplifier.

6. The variable gain amplifier assembly of claim 3 wherein the plurality of amplify modes includes a low gain amplify mode, a medium gain amplify mode, and a high gain amplify mode.

7. The variable gain amplifier assembly of claim 1 wherein the feedback network includes a variable resistor having a plurality of resistance values coupled between the signal input and the signal output.

8. The variable gain amplifier assembly of claim 7 wherein the controller is configured to adjust the resistance of the feedback network by selecting a resistance value from the plurality of resistance values of the variable resistor.

9. The variable gain amplifier assembly of claim 1 wherein the feedback network includes a plurality of feedback resistors configured to be switchably coupled between the signal input and the signal output.

10. The variable gain amplifier assembly of claim 9 wherein the controller is configured to adjust the resistance of the feedback network by coupling at least one feedback resistor of the plurality of feedback resistors between the signal input and the signal output.

11. The variable gain amplifier assembly of claim 1 further comprising a bypass path coupled in parallel with the variable gain amplifier and the feedback network between the signal input and the signal output.

12. The variable gain amplifier assembly of claim 11 wherein during a bypass mode, the signal received at the signal input is switchably routed to the signal output via the bypass path.

13. The variable gain amplifier assembly of claim 11 wherein the bypass path includes a bypass attenuator.

14. A method for operating a variable gain amplifier assembly, the method comprising:
   receiving an input signal having an input signal level at a signal input of the variable gain amplifier assembly;
   selecting one of a plurality of amplify modes for a variable gain amplifier, the selected amplify mode being based on the input signal level and a desired output signal level at a signal output of the variable gain amplifier assembly; and
   adjusting a feedback resistance between the signal input and the signal output based on the selected amplify mode of the variable gain amplifier to stabilize an input-referred linearity of the variable gain amplifier during the selected amplify mode.

15. The method of claim 14 wherein selecting each of the plurality of amplify modes provides a different gain to the signal received at the signal input.

16. The method of claim 15 further comprising providing a bias current to the variable gain amplifier, the bias current varying based on the desired output signal level and the selected amplify mode of the variable gain amplifier.

17. The method of claim 14 wherein adjusting the feedback resistance includes selectively coupling at least one feedback resistor of a plurality of feedback resistors between the signal input and the signal output.

18. The method of claim 14 wherein adjusting the feedback resistance includes adjusting a variable resistor by selecting a resistance value from a plurality of resistance values of the variable resistor.

19. The method of claim 14 wherein adjusting the feedback resistance to stabilize the input-referred linearity of the variable gain amplifier during the selected amplify mode further includes adjusting the feedback resistance to maintain a substantially constant input-referred third order intercept point (IIP3).

20. A variable gain amplifier assembly having a signal input and a signal output, the variable gain amplifier assembly comprising:
   a variable gain amplifier including a plurality of unit cell groups, each unit cell group of the plurality of unit cell groups including at least one unit cell having at least one transistor, the variable gain amplifier configured to apply a different gain to a signal received at the signal input during each of a plurality of amplify modes, each of the plurality of amplify modes corresponding to at least one unit cell group of the plurality of unit cell groups;
   a feedback network coupled in parallel with the variable gain amplifier between the signal input and the signal output, the feedback network having a resistance; and
   a controller configured to select one of the plurality of amplify modes for the variable gain amplifier based on at least an amplitude of the signal received at the signal input and to adjust the resistance of the feedback network to maintain a substantially constant input-referred third order intercept point (IIP3) of the variable gain amplifier during each of the plurality of amplify modes.

* * * * *

UNITED STATES PATENT AND TRADEMARK OFFICE
CERTIFICATE OF CORRECTION

PATENT NO. : 10,812,030 B2
APPLICATION NO. : 16/551955
DATED : October 20, 2020
INVENTOR(S) : Peihua Ye et al.

Page 1 of 1

It is certified that error appears in the above-identified patent and that said Letters Patent is hereby corrected as shown below:

In the Specification

Column 26, Line 41, delete "(Tref)" and insert -- (Iref) --.

Signed and Sealed this
Twenty-fourth Day of November, 2020

Andrei Iancu
*Director of the United States Patent and Trademark Office*